US010026486B1

(12) United States Patent
Dutta et al.

(10) Patent No.: US 10,026,486 B1
(45) Date of Patent: Jul. 17, 2018

(54) FIRST READ COUNTERMEASURES IN MEMORY

(71) Applicant: SanDisk Technologies LLC, Plano, TX (US)

(72) Inventors: Deepanshu Dutta, Fremont, CA (US); Idan Alrod, Herzliya (IL); Huai-Yuan Tseng, San Ramon, CA (US); Amul Desai, Milpitas, CA (US); Jun Wan, San Jose, CA (US); Ken Cheah, San Jose, CA (US); Sarath Puthenthermadam, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/451,186

(22) Filed: Mar. 6, 2017

(51) Int. Cl.
| | |
|---|---|
| *G11C 16/04* | (2006.01) |
| *G11C 16/34* | (2006.01) |
| *G11C 16/26* | (2006.01) |
| *G11C 16/16* | (2006.01) |

(52) U.S. Cl.
CPC .......... *G11C 16/3413* (2013.01); *G11C 16/16* (2013.01); *G11C 16/26* (2013.01); *G11C 16/3445* (2013.01); *G11C 16/3459* (2013.01)

(58) Field of Classification Search
CPC ..... G11C 16/3413; G11C 16/16; G11C 16/26; G11C 16/3445; G11C 16/3459
USPC .................................................... 365/185.11
See application file for complete search history.

(56) References Cited

U.S. PATENT DOCUMENTS

| | | |
|---|---|---|
| 6,343,033 B1 | 1/2002 | Parker |
| 6,751,146 B1 | 6/2004 | Wang et al. |
| 7,450,421 B2 | 11/2008 | Mokhlesi et al. |
| 8,406,053 B1 | 3/2013 | Dutta |
| 8,472,266 B2 | 6/2013 | Khandelwal et al. |
| 8,576,624 B2 | 11/2013 | Dutta |
| 8,711,634 B2 | 4/2014 | Futatsuyama et al. |
| 8,792,274 B1 | 7/2014 | Tang et al. |
| 9,123,389 B1 | 9/2015 | Park |
| 9,324,439 B1 | 4/2016 | Chen et al. |
| 9,378,830 B2 | 6/2016 | Khoueir et al. |
| 9,412,463 B1 | 8/2016 | Chen et al. |
| 2009/0052255 A1 | 2/2009 | Moon et al. |

(Continued)

OTHER PUBLICATIONS

Response to Restriction Requirement dated Jul. 17, 2017, U.S. Appl. No. 15/333,440, filed Oct. 25, 2016.

(Continued)

*Primary Examiner* — Huan Hoang
(74) *Attorney, Agent, or Firm* — Vierra Magen Marcus LLP

(57) ABSTRACT

Techniques are provided for improving the accuracy of read operations of memory cells, where the threshold voltage of the memory cells can shift depending on the coupled up state of the word lines. In one approach, for a read operation, a representative word line voltage in a block is detected and a corresponding set of read voltages is selected. In another approach, a pre-read voltage pulse is applied to a selected word line in response to a read command, just prior to reading the selected cells. In another approach, a voltage pulse is periodically applied to each word line in a block to provide the word lines in a coupled up state. In another approach, a soft erase is performed after a read operation to prevent coupling up of the word lines.

16 Claims, 33 Drawing Sheets

(56) References Cited

U.S. PATENT DOCUMENTS

| | | | |
|---|---|---|---|
| 2010/0027314 | A1 | 2/2010 | Chevallier et al. |
| 2011/0032746 | A1* | 2/2011 | Maejima ............ G11C 13/0007 365/148 |
| 2013/0070524 | A1 | 3/2013 | Dutta |
| 2013/0148425 | A1 | 6/2013 | Dutta |
| 2013/0235649 | A1 | 9/2013 | Lindstadt et al. |
| 2014/0098593 | A1 | 4/2014 | Calderoni et al. |
| 2014/0119101 | A1 | 5/2014 | Wang et al. |
| 2014/0140148 | A1* | 5/2014 | An ...................... G11C 11/5642 365/189.14 |
| 2015/0023097 | A1 | 1/2015 | Khoueir et al. |
| 2015/0092488 | A1 | 4/2015 | Wakchaure et al. |
| 2015/0364185 | A1 | 12/2015 | Yoo |
| 2016/0071601 | A1 | 3/2016 | Shirakawa et al. |
| 2016/0172045 | A1 | 6/2016 | Shukla et al. |

OTHER PUBLICATIONS

Non-final Office Action dated Aug. 9, 2017, U.S. Appl. No. 15/333,440, filed Oct. 25, 2016.
Restriction Requirement dated Sep. 25, 2017, U.S. Appl. No. 15/440,185, filed Feb. 23, 2017.
Response to Restriction Requirement dated Oct. 18, 2017, U.S. Appl. No. 15/440,185, filed Feb. 23, 2017.
Response to Office Action dated Oct. 20, 2017, U.S. Appl. No. 15/333,440, filed Oct. 25, 2016.
U.S. Appl. No. 15/333,440, filed Oct. 25, 2016.
U.S. Appl. No. 15/440,185, filed Feb. 23, 2017.
Restriction Requirement dated Jun. 15, 2017, U.S. Appl. No. 15/333,440, filed Oct. 25, 2016.
U.S. Appl. No. 15/198,205, filed Jun. 30, 2016 by Dong et al.
U.S. Appl. No. 15/198,228, filed Jun. 30, 2016 by Pang et al.
Notice of Allowance dated Dec. 11, 2017, U.S. Appl. No. 15/333,440, filed Oct. 25, 2016.
Non-final Office Action dated Dec. 22, 2017, U.S. Appl. No. 15/440,185, filed Feb. 23, 2017.
Non-final Office Action dated Jan. 2, 2018, U.S. Appl. No. 15/816,546, filed Mar. 6, 2017.
U.S. Appl. No. 15/816,546, filed Nov. 17, 2017 by Dutta et al.
Response to Office Action dated Mar. 20, 2018, U.S. Appl. No. 15/440,185, filed Feb. 23, 2017.
U.S. Appl.No. 15/921,165, filed Mar. 14, 2018, by Alrod et al.
U.S. Appl.No. 15/921,184, filed Mar. 14, 2018, by Alrod et al.
International Search Report & The Written Opinion of the International Searching Authority dated Mar. 6, 2018, International Application No. PCT/US2017/063670.

* cited by examiner

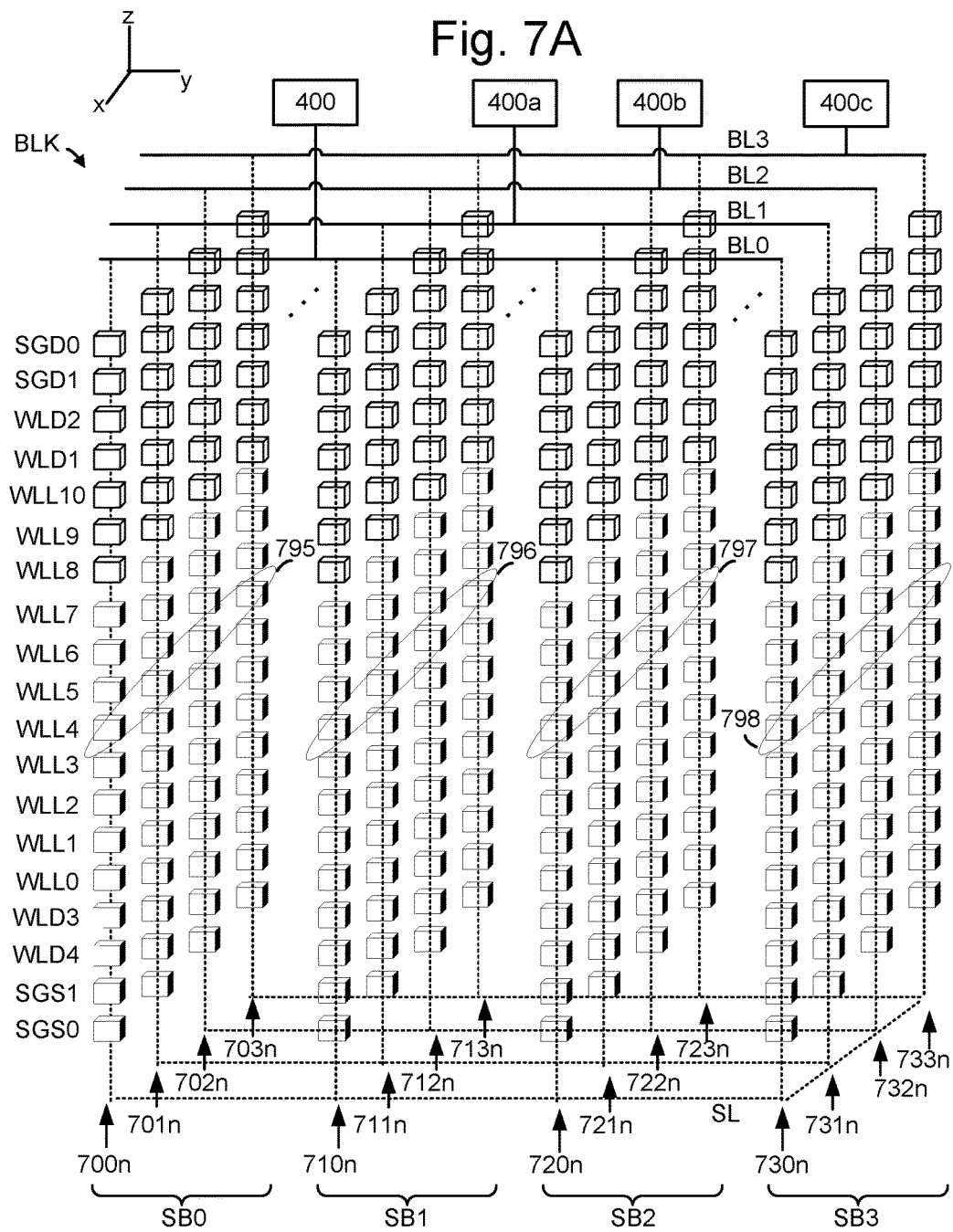

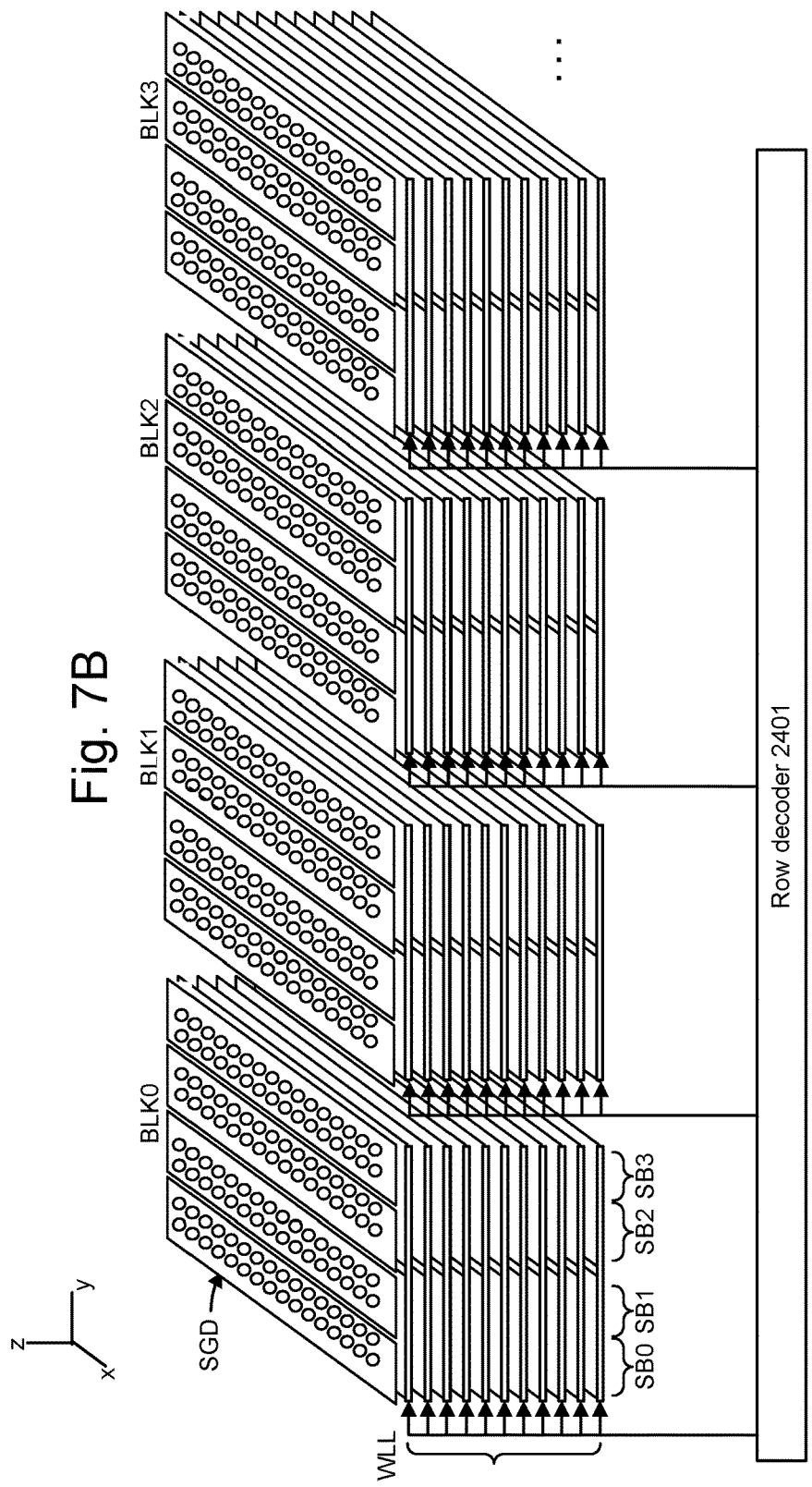

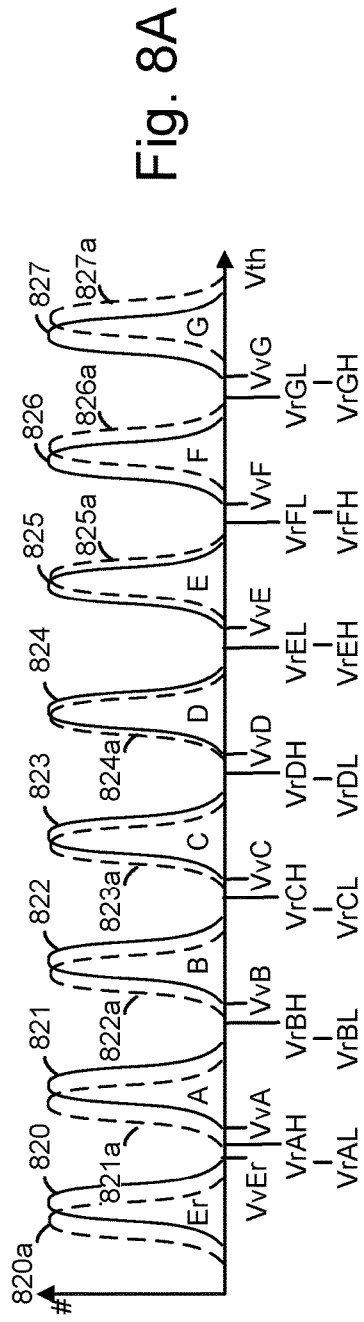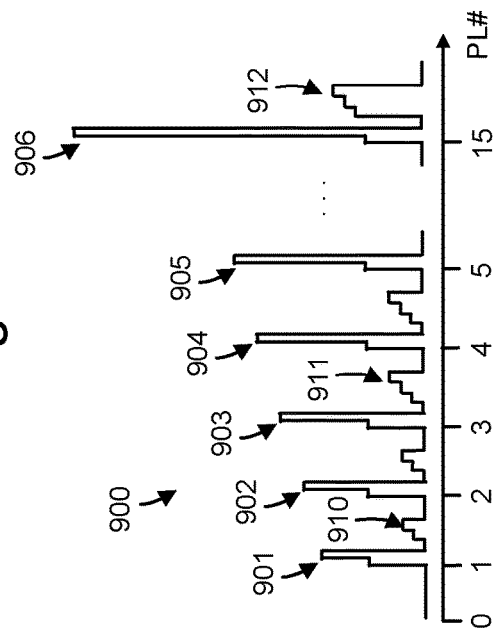

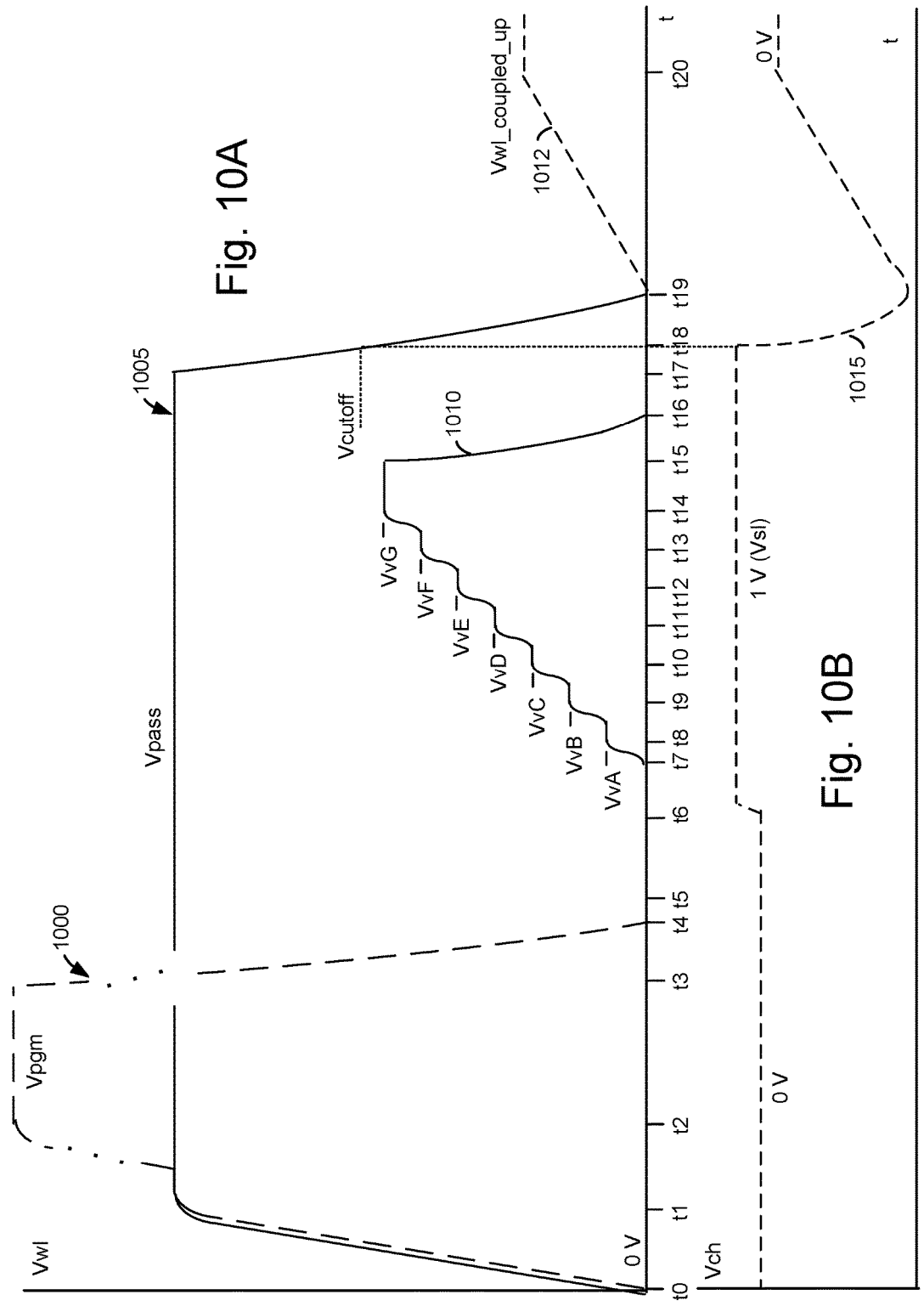

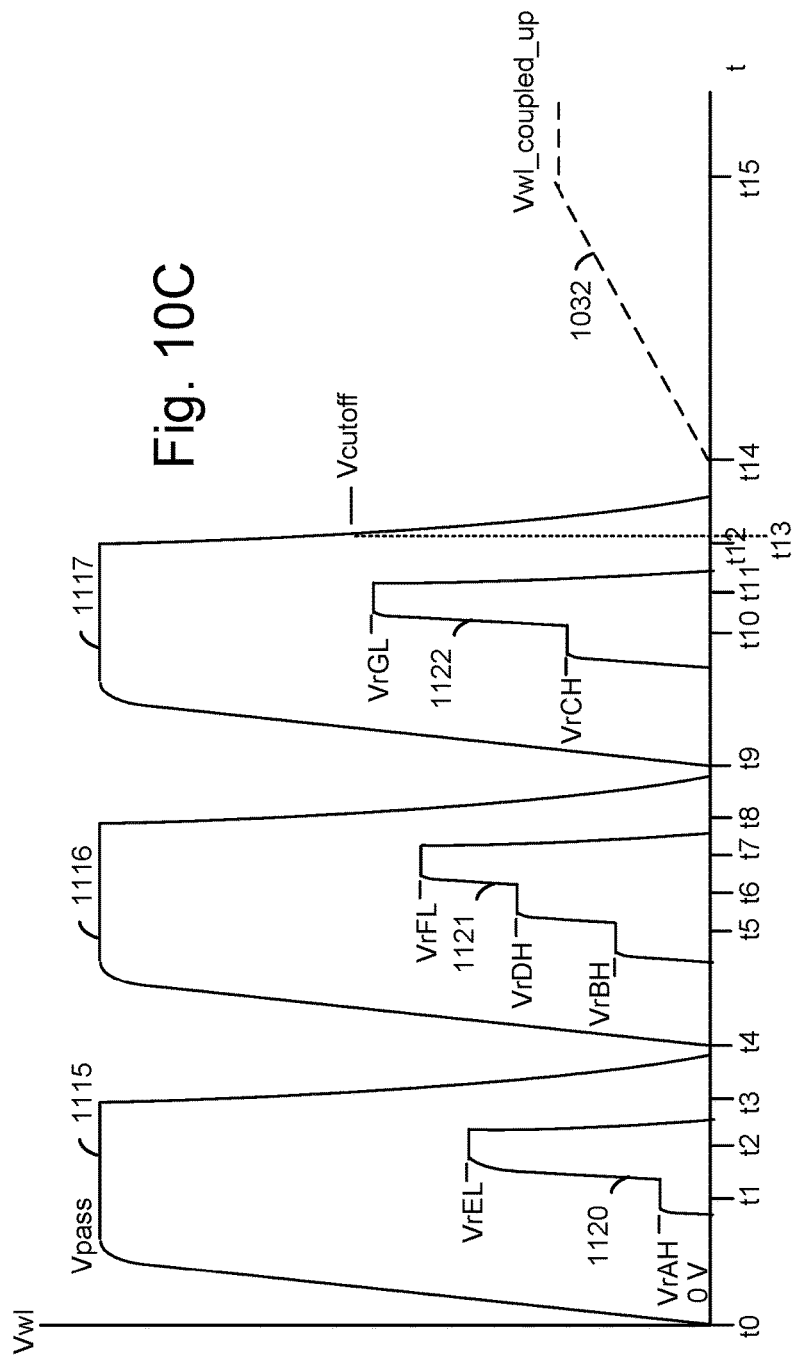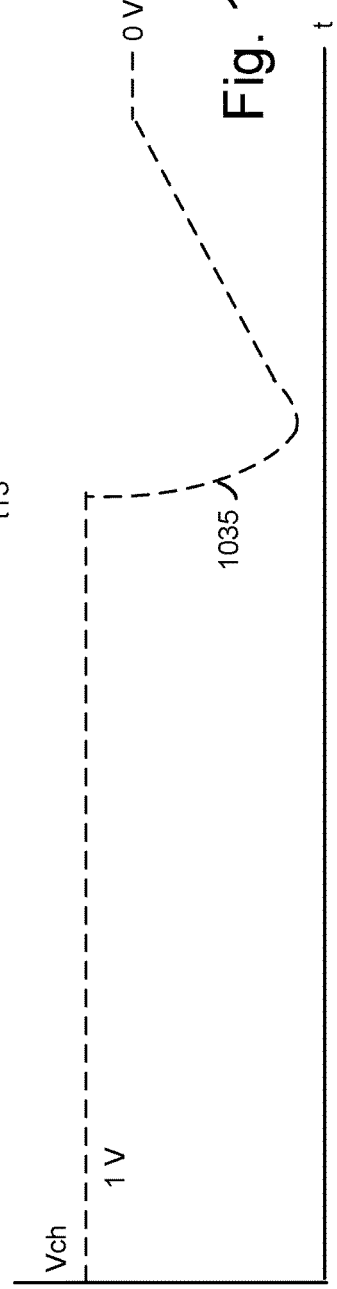

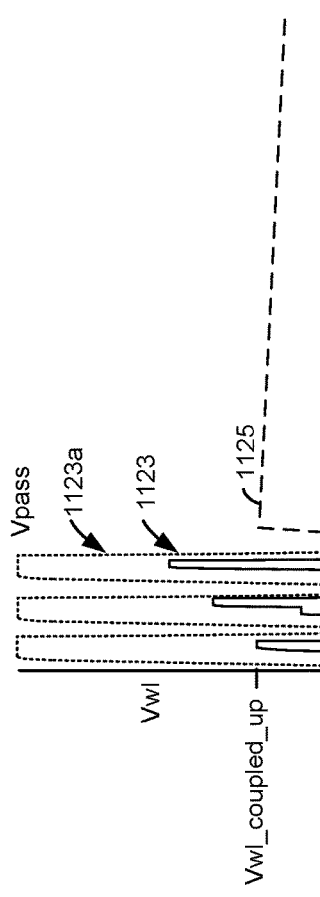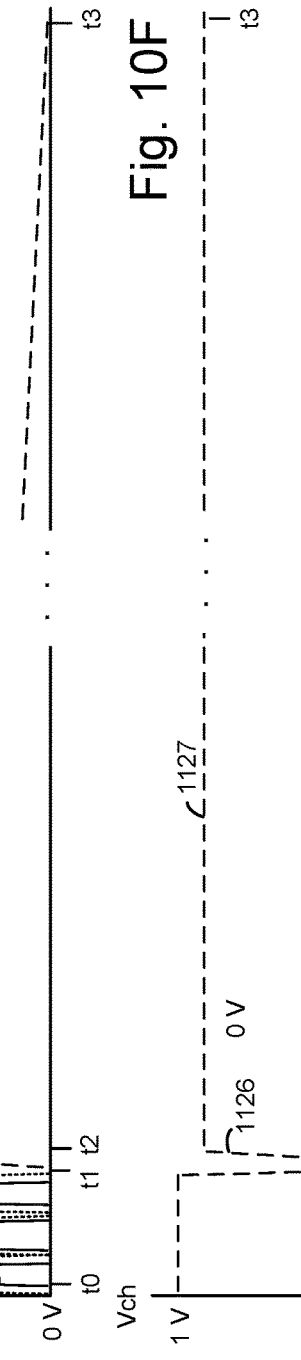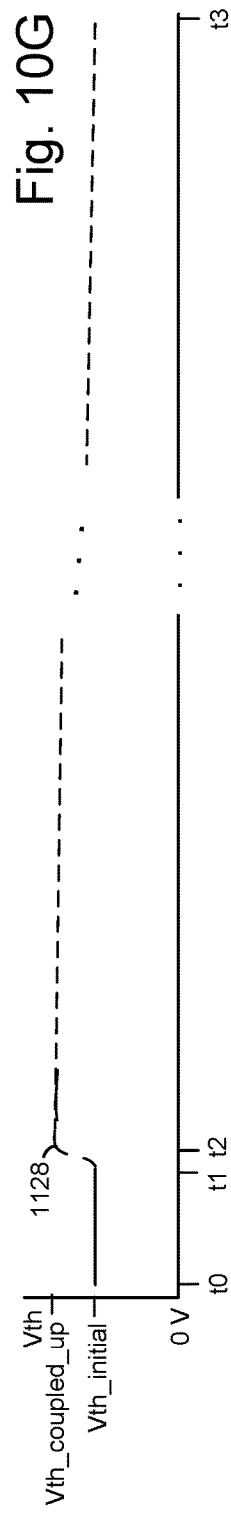

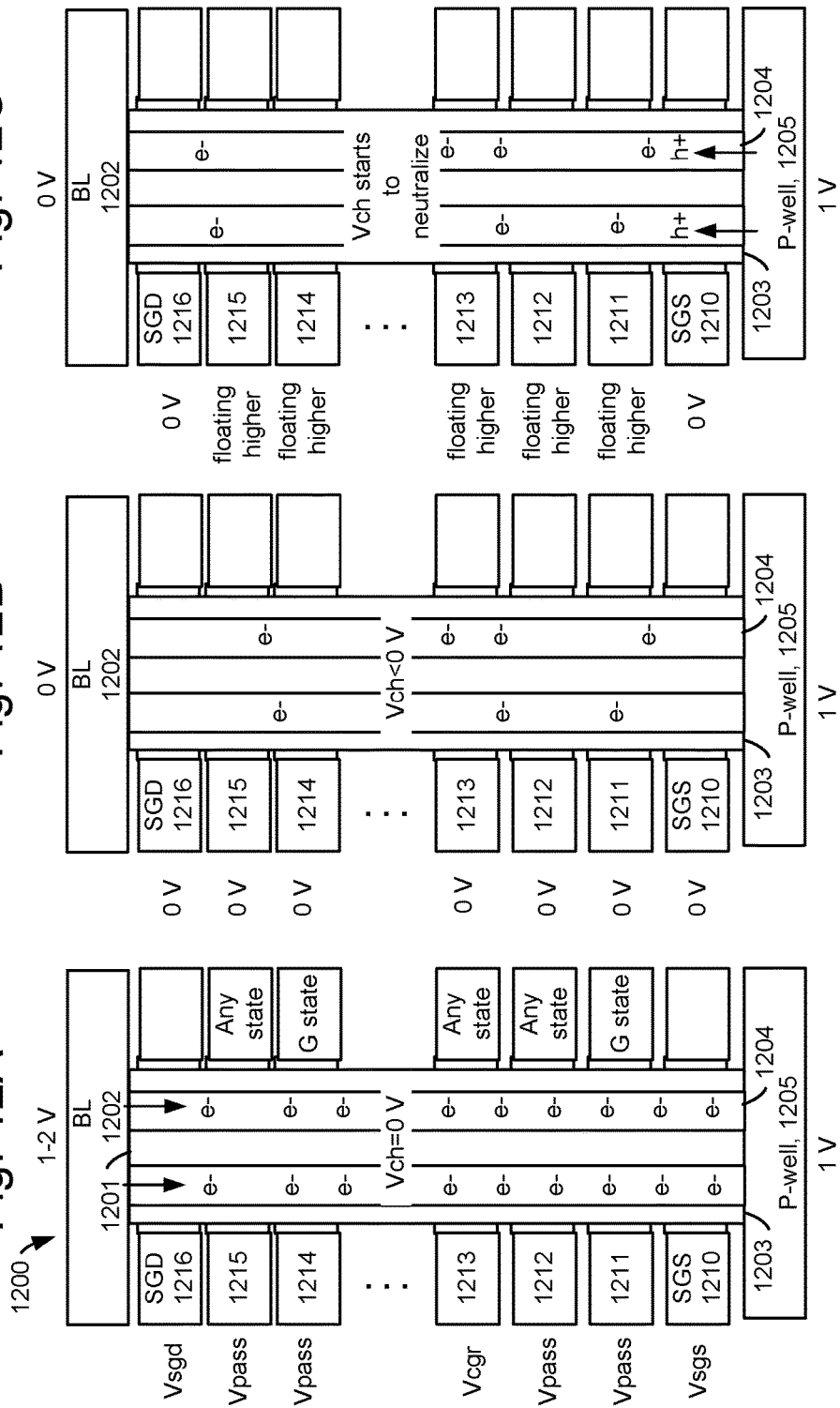
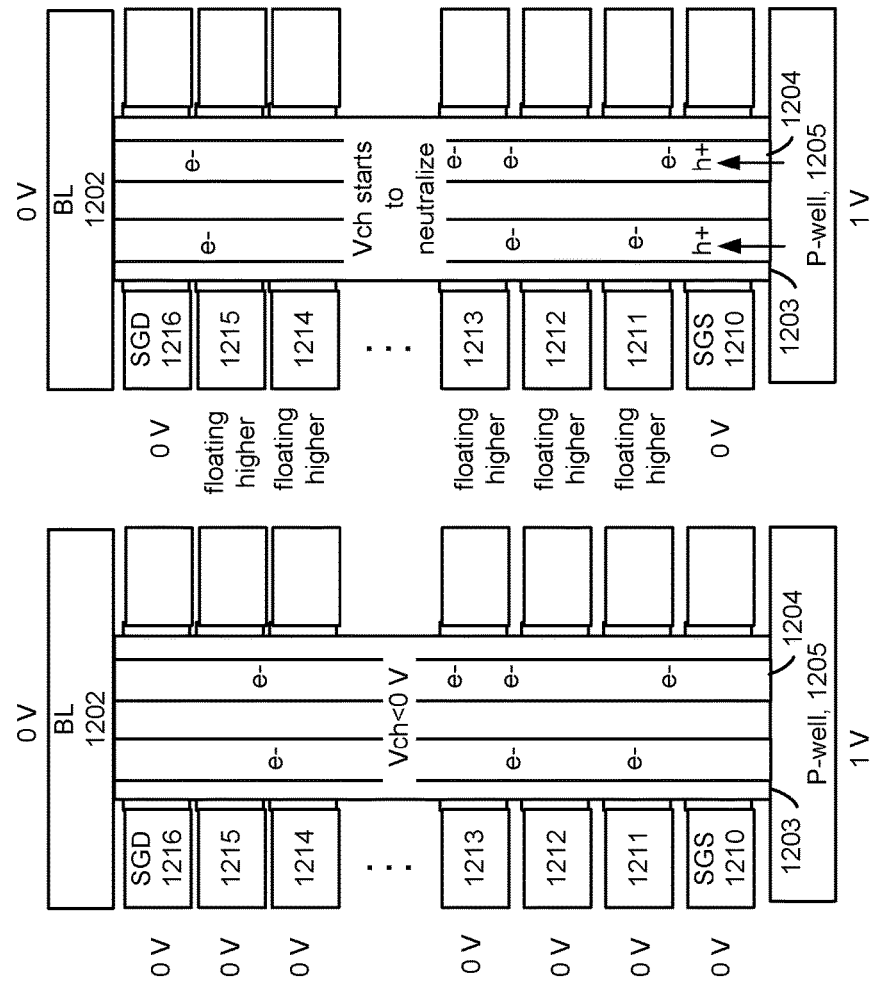
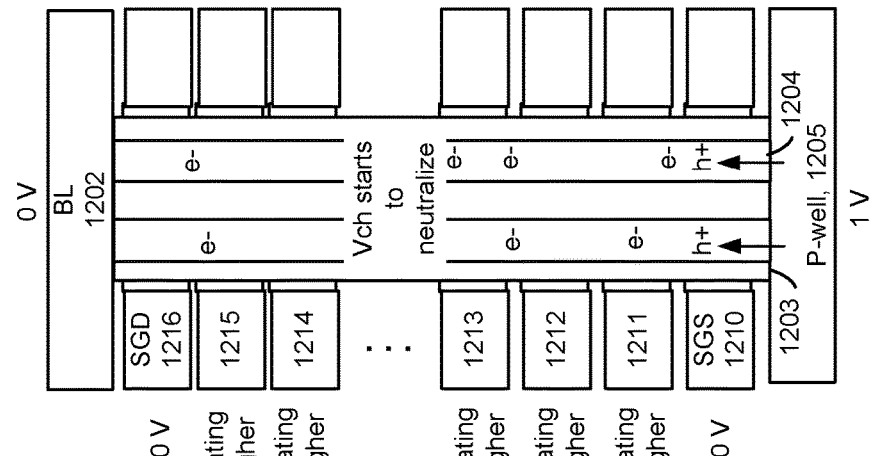

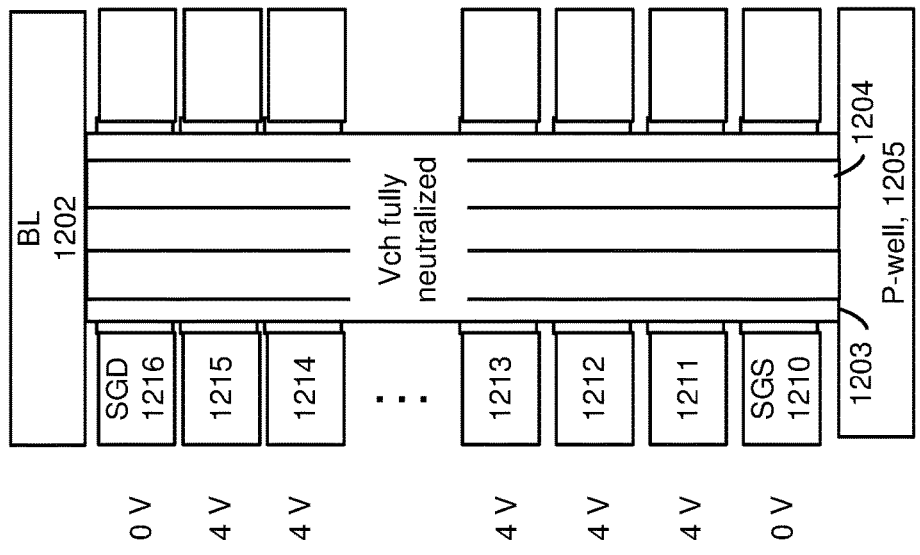

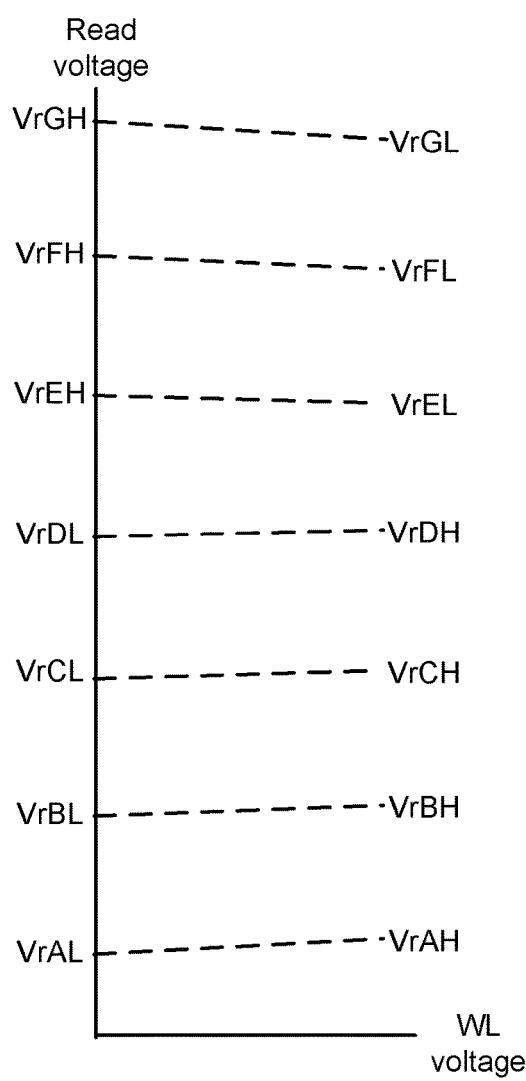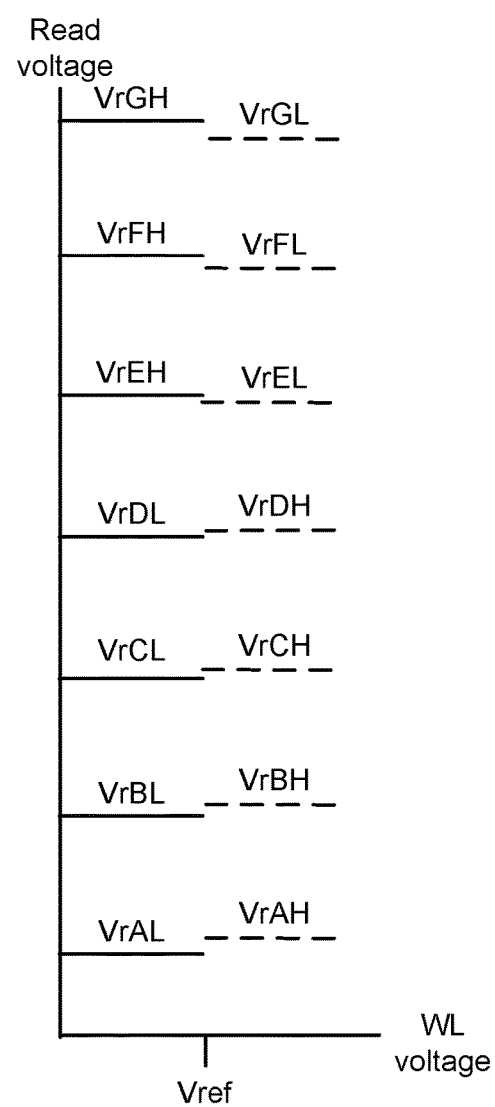

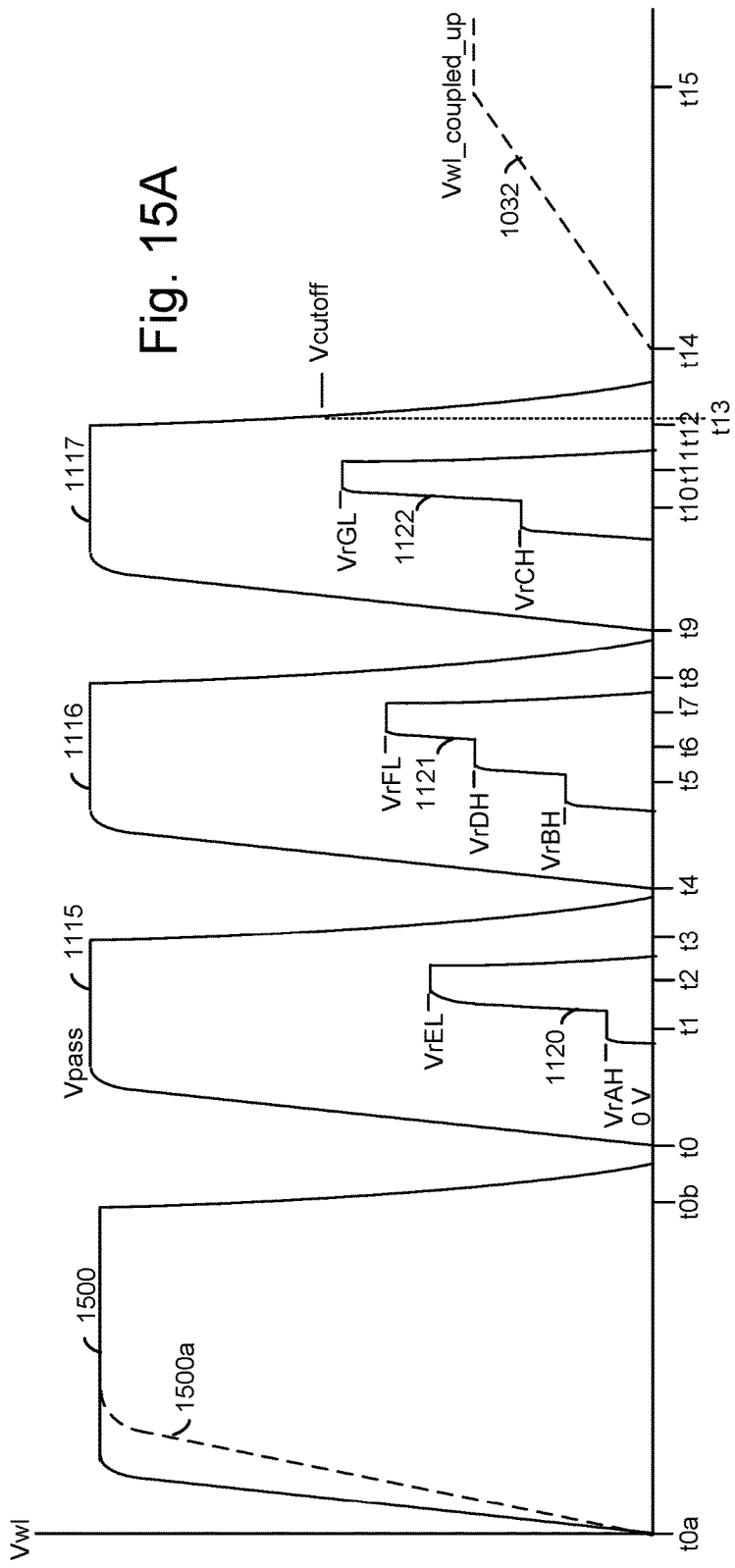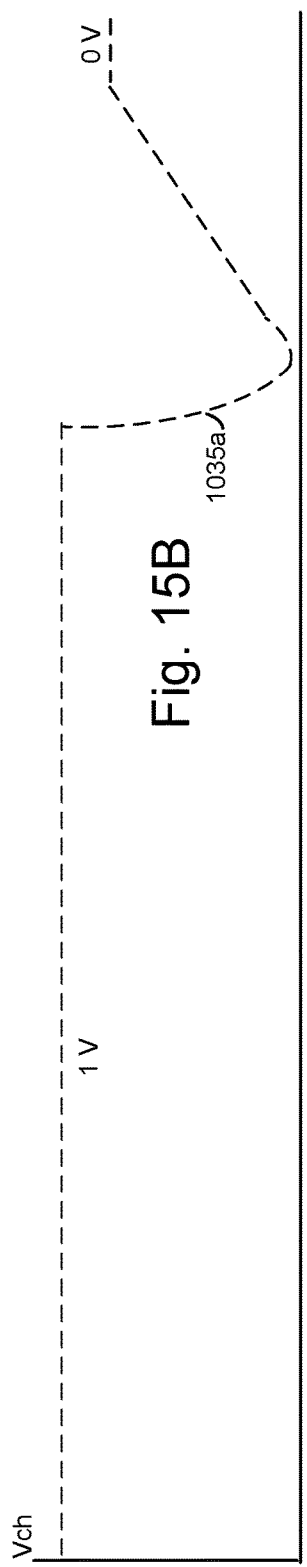

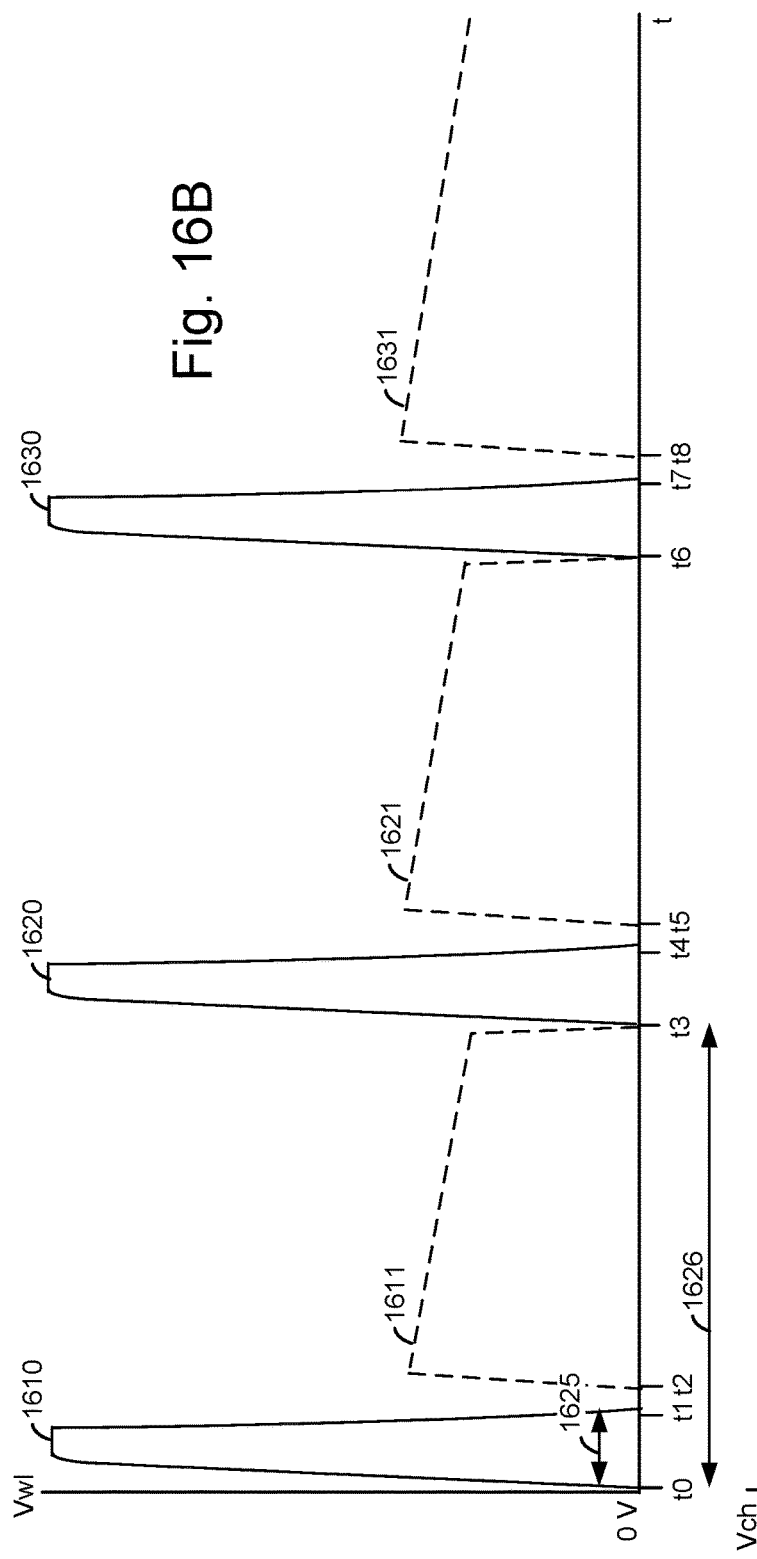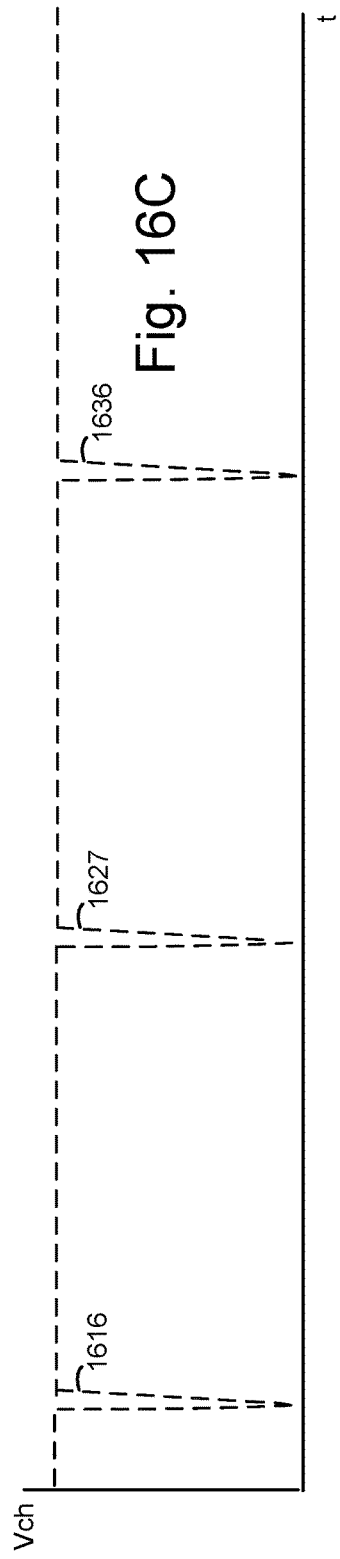

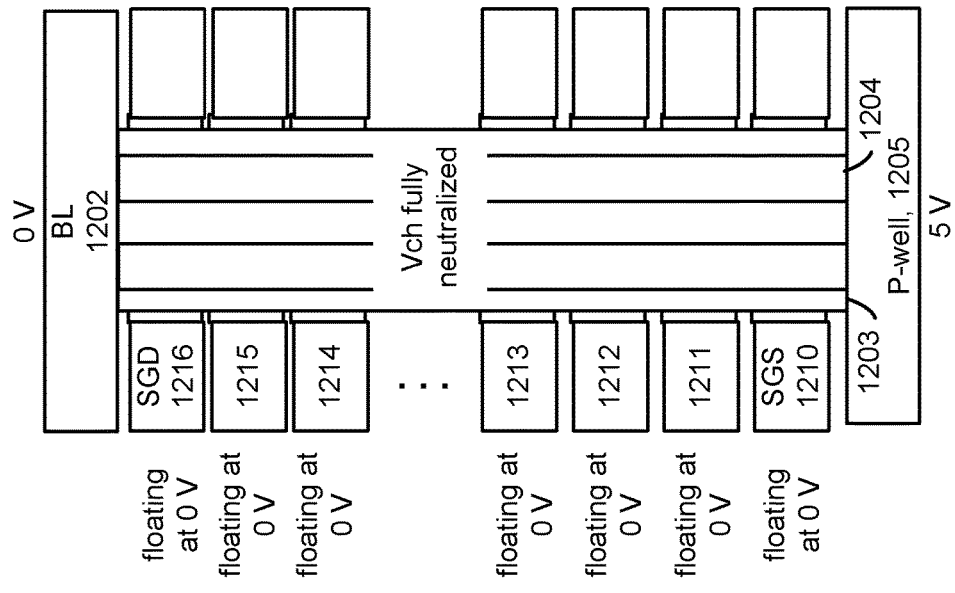
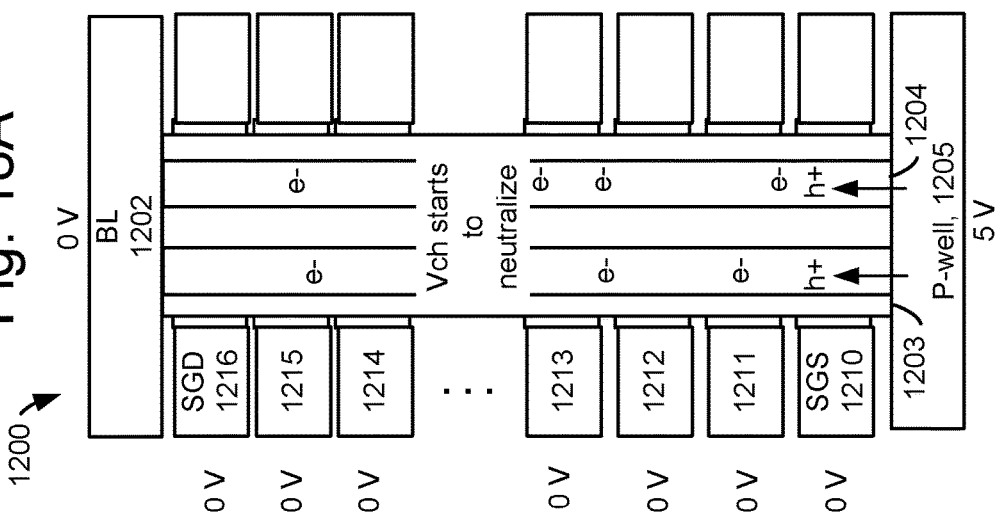

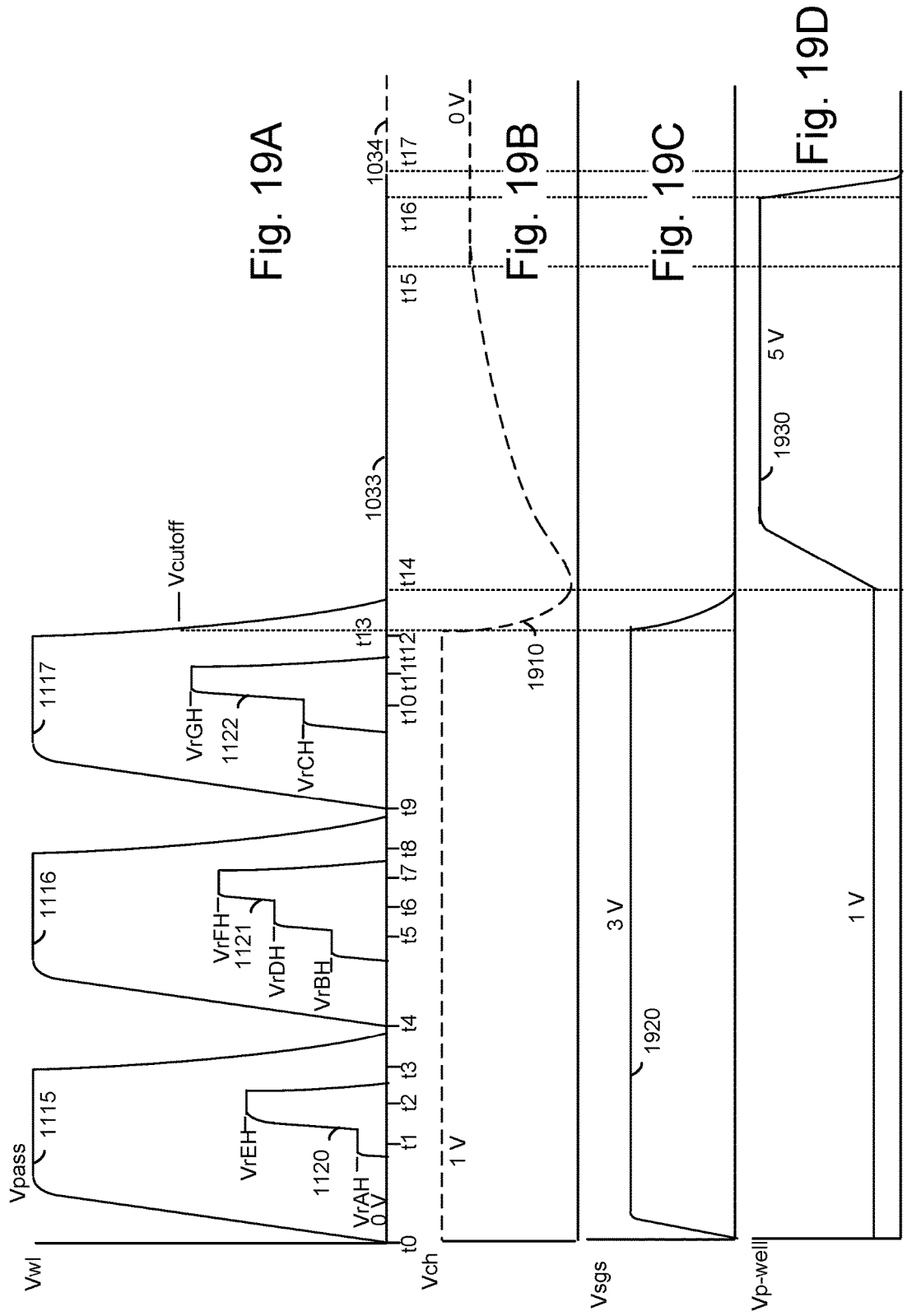

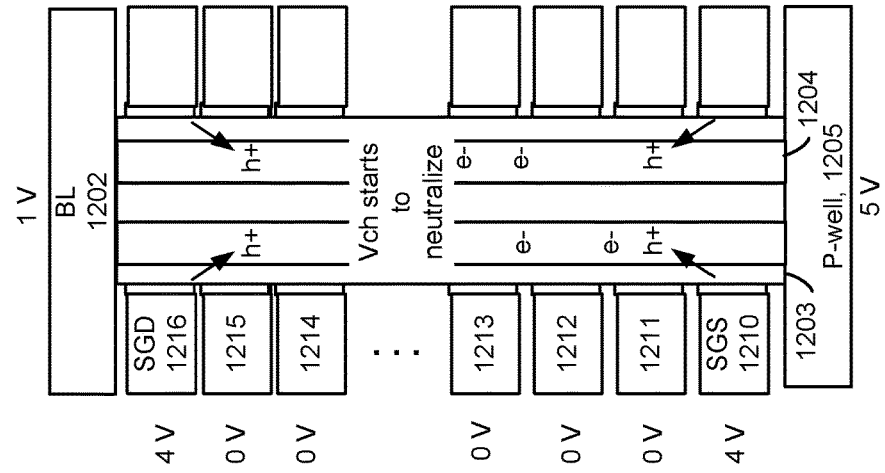
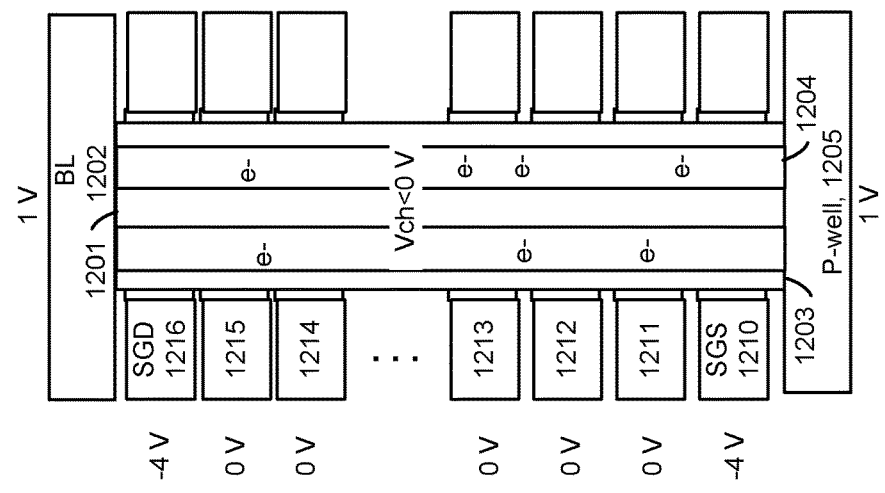
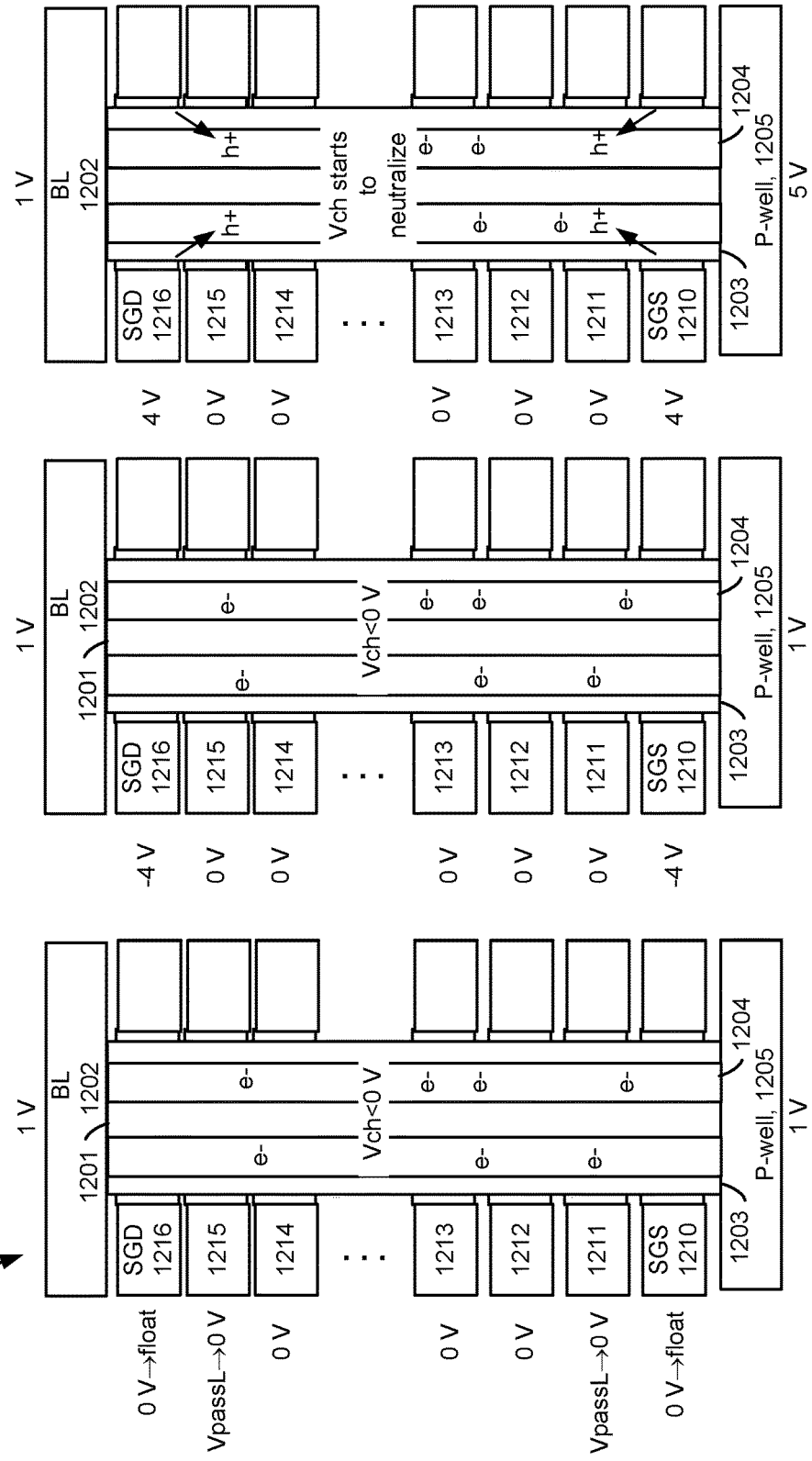

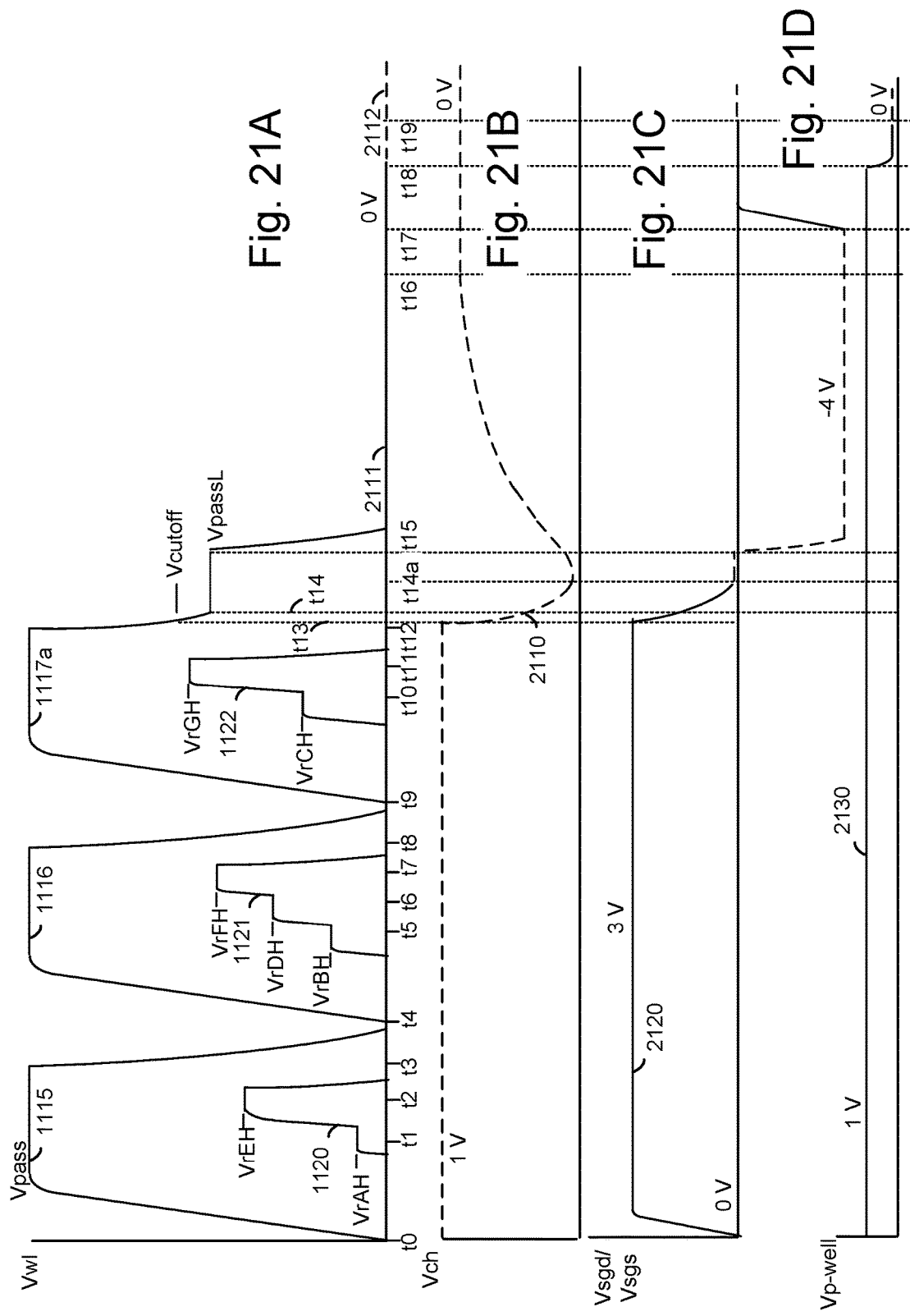

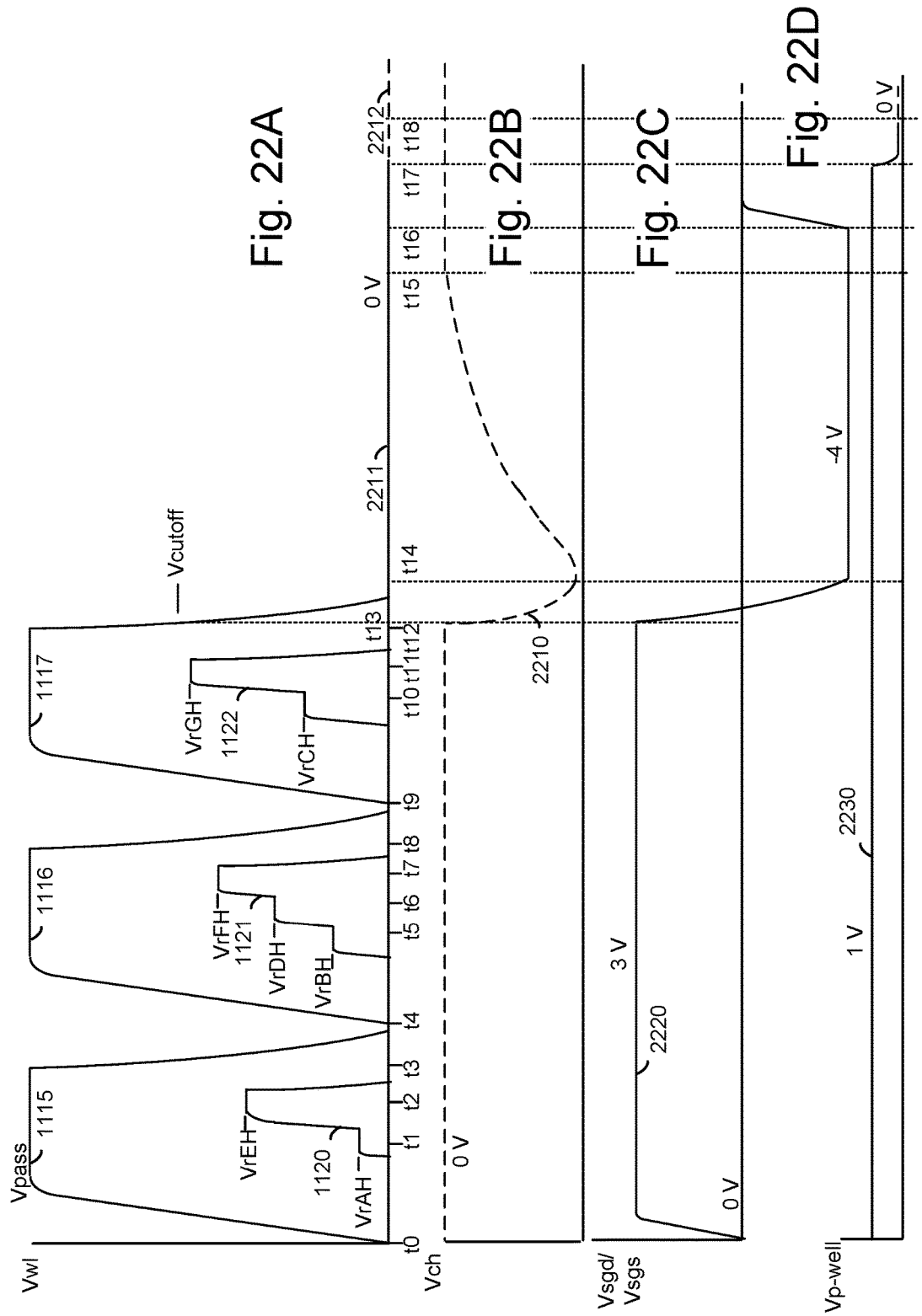

FIRST READ COUNTERMEASURES IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 7A depicts an example view of NAND strings in sub-blocks in a 3D configuration which is consistent with FIG. 4.

FIG. 7B depicts word line and SGD layers in an example set of blocks which is consistent with FIG. 4.

FIG. 8A depicts an example Vth distribution of memory cells, where eight data states are used, in a first read condition compared to a second read condition.

FIG. 8B depicts example bit sequences for lower, middle and upper pages of data, and associated read voltages, for the Vth distributions of FIG. 8A.

FIG. 9 depicts a waveform of an example programming operation.

FIG. 10A depicts a plot of example waveforms in a programming operation, showing coupling up of a word line voltage.

FIG. 10B depicts a plot of a channel voltage (Vch) corresponding to FIG. 10A.

FIG. 10C depicts a plot of example waveforms in a read operation, showing coupling up of a word line voltage.

FIG. 10D depicts a plot of a channel voltage (Vch) corresponding to FIG. 10C.

FIG. 10E depicts the waveforms of FIG. 10C showing a decay of the coupled up voltage of the word line.

FIG. 10F depicts a plot of a channel voltage consistent with FIG. 10E.

FIG. 10G depicts a plot of a Vth of a memory cell connected to the coupled up word line, consistent with FIGS. 10E and 10F.

FIG. 12A depicts a configuration of an example memory string just before word lines are discharged at the end of a sensing operation.

FIG. 12B depicts a configuration of an example memory string just after word lines are discharged at the end of a sensing operation.

FIG. 12C depicts a configuration of an example memory string when word lines are coupled up by the channel.

FIG. 12D depicts a configuration of an example memory string when word lines have completed coupling up.

FIG. 13C depicts a plot showing a trend of read voltage versus a detected word line voltage.

FIG. 13D depicts a plot of read voltage versus a detected word line voltage, where two sets of read voltages are used in an example implementation of FIG. 13C.

FIG. 15A depicts a plot of example waveforms in a read operation similar to FIG. 10C, where a pre-read voltage pulse is applied before the read operation.

FIG. 15B depicts a plot of a channel voltage (Vch) corresponding to FIG. 15A.

FIG. 16B depicts a plot of periodic voltage pulses consistent with the process of FIG. 16A.

FIG. 16C depicts a plot of channel voltage consistent with FIG. 16B.

FIG. 18A depicts a configuration of the example memory string 1200 of FIG. 12A when holes are introduced into the channel from the substrate and the channel starts to neutralize in a soft erase operation consistent with step 1702 of FIG. 17.

FIG. 18B depicts a configuration of an example memory string when the channel is fully neutralized in a soft erase operation consistent with step 1702 of FIGS. 17 and 18A.

FIG. 19A depicts a plot of example waveforms in a read operation which is followed by a soft erase.

FIG. 19B depicts a channel voltage during a soft erase.

FIG. 19C depicts an SGS transistor voltage during a soft erase.

FIG. 19D depicts a p-well voltage during a soft erase.

FIG. 20A depicts a configuration of an example memory string just after word lines are discharged at the end of a sensing operation, where SGD and SGS transistor voltages are lowered using coupling in a soft erase operation consistent with step 1702 of FIG. 17.

FIG. 20B depicts a configuration of an example memory string just after word lines are discharged at the end of a sensing operation, where SGD and SGS transistor voltages are lowered using a driven negative voltage in a soft erase operation consistent with step 1702 of FIG. 17.

FIG. 20C depicts a configuration of an example memory string when holes are introduced into the channel from the SGD and SGS transistors using GIDL and the channel starts to neutralize in a soft erase operation consistent with step 1702 of FIG. 17 and with FIG. 20A or 20B.

FIG. 21A depicts a plot of example waveforms in a read operation followed by a soft erase in which the pass voltage ramps down to VpassL before ramping down to 0 V, consistent with FIGS. 20A and 20C.

FIG. 21B depicts a channel voltage during one example of a soft erase.

FIG. 21C depicts an SGS and/or SGD transistor voltage during one example of a soft erase.

FIG. 21D depicts a p-well voltage during one example of a soft erase.

FIG. 22A depicts a plot of example waveforms in a read operation followed by a soft erase.

FIG. 22B depicts a channel voltage during one example of a soft erase.

FIG. 22C depicts an SGS and/or SGD transistor voltage during one example of a soft erase.

FIG. 22D depicts a p-well voltage during one example of a soft erase.

DETAILED DESCRIPTION

Figure 1A:
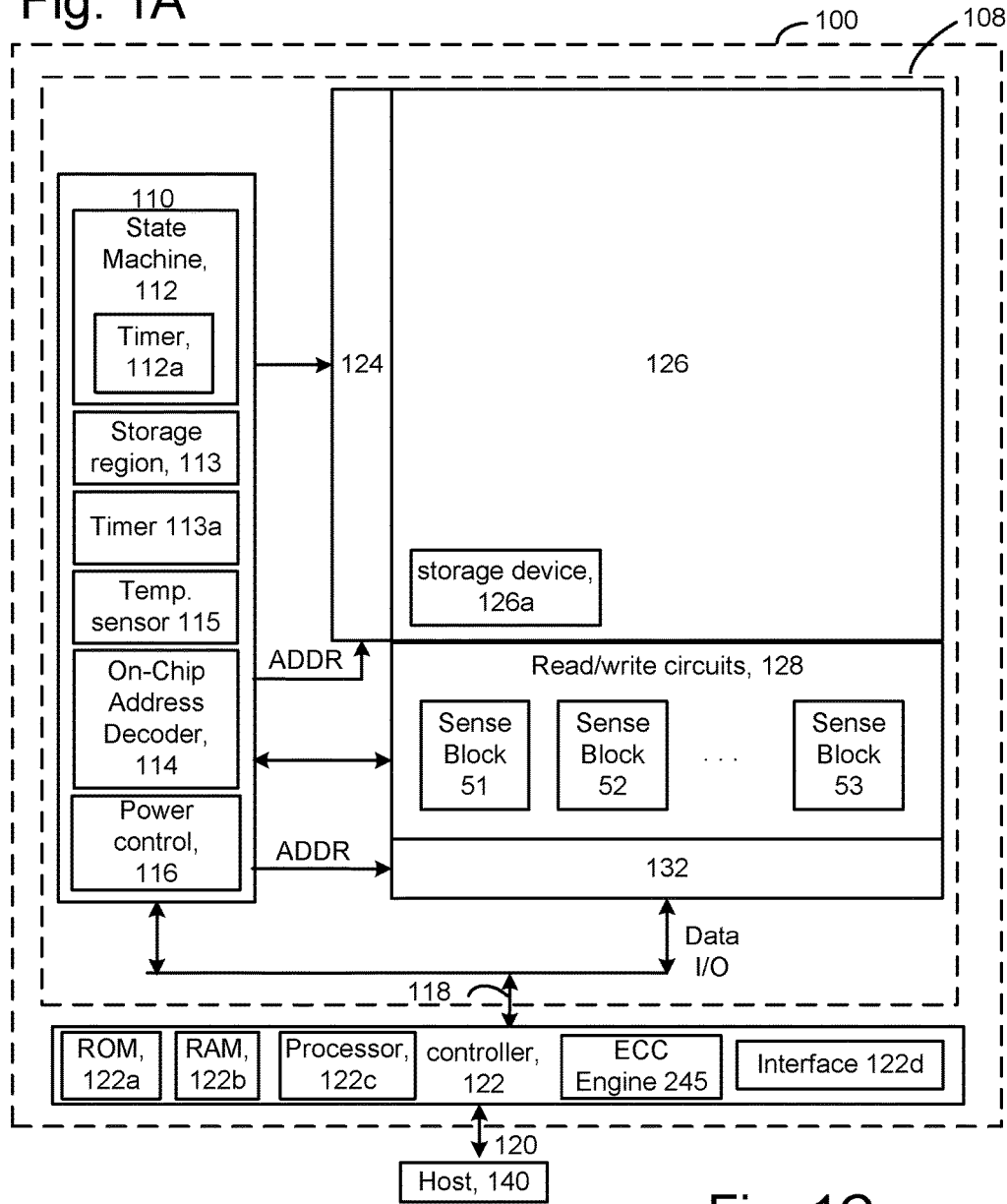
FIG. 1A is a block diagram of an example memory device.

Techniques are provided for improving the accuracy of read operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8A). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can vary depending on when the read operation occurs. For example, the Vth can vary in the memory cells depending on a coupled up state of the word lines when the read operation occurs. A "first read" condition can be defined in which the word lines are not coupled up, and a "second read" condition can be defined in which the word lines are coupled up.

The memory cells can be in the first read condition after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read condition after a significant amount of time has passed after a last sensing operation, since the word lines discharge over time. The coupling up of the word lines causes a Vth shift in the cells due to inadvertent programming or erasing. Since the word lines are not significantly coupled up while in the first read condition, this Vth does not occur.

The cells can be in the second read condition when the read occurs shortly, e.g., seconds or minutes, after a last sensing operation. Since the word lines are relatively strongly coupled up while in the second read condition, there is a programming or erasing of the cells due to the word line voltage, and a corresponding shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there can be a weak erasing of cells which have a relatively high Vth, higher than the coupled-up voltage, e.g., cells in higher programmed data states, thus resulting in a Vth downshift for these cells.

The cells gradually transition from the second read condition to the first read condition over time, e.g., one hour, as the word lines are discharged.

The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read/verify voltage) to a selected word line. At the same time, a read pass voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. For cells in the lower data states, the Vth gradually decreases as electrons which are trapped in the charge trapping material of the cells are de-trapped and return to the channel. For cells in the higher data states, the Vth gradually increases as electrons are removed from the channel. See FIG. 8A.

When a read operation occurs, it is not known if the cells are in the first or second read condition, or perhaps somewhere in between these two conditions. One approach is to track the elapsed time since a power on event or a previous sensing operation. However, this elapsed time may not accurately indicate whether the word lines are coupled up, or the extent of the coupling up, since other factors such as environmental factors and process variations may be relevant. Moreover, separate tracking of each block would be needed.

Techniques provided herein address the above and other issues.

Figure 1B:
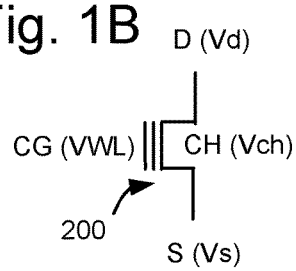
FIG. 1B depicts an example memory cell 200.
Figure 1C:
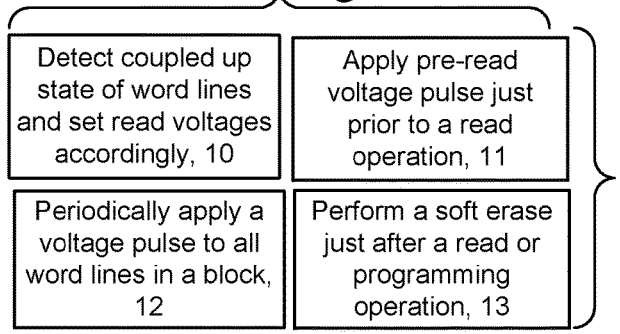
FIG. 1C depicts various features disclosed herein.

FIG. 1C depicts various features disclosed herein. A first feature includes detecting a coupled up state of word lines and setting read voltages accordingly (block 10). A second feature includes applying a pre-read voltage pulse just prior to a read operation (block 11). A third feature includes periodically applying a voltage pulse to all word lines in block (block 12). This can occur independently of a read command, and involves refreshing the threshold voltages of the memory cells to the second read condition. A fourth feature includes performing a soft erase just after a read or programming operation (block 13).

Various other features and benefits are described below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The state machine may include a clock 112a to determine an elapsed time since a last sensing operation, as discussed further below. A storage region 113 may be provided, e.g., for sets of read voltage, as described further below. Generally, the storage region may store operational parameters and software/code. A timer 113a may be used to determine when to periodically apply a voltage pulse to word lines, as described below in connection with FIGS. 13E and 16A, for example. A temperature sensor 115 may also be provided. See FIG. 1D.

In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 24. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example memory cell 200. The memory cell comprises a control gate CG which receives a word line voltage Vwl, a drain at a voltage Vd, a source at a voltage Vs and a channel at a voltage Vch.

Figure 1D:
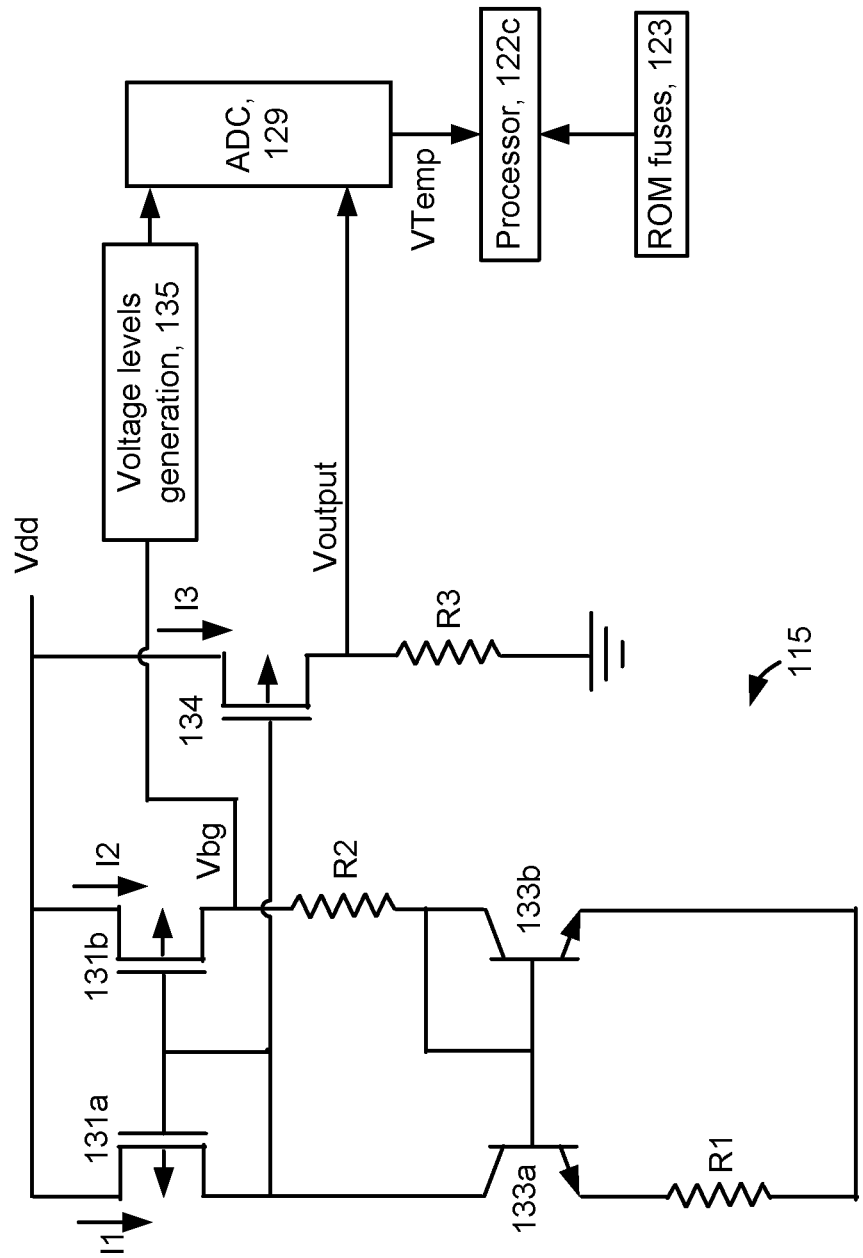
FIG. 1D depicts an example of the temperature-sensing circuit 115 of FIG. 1A.

FIG. 1D depicts an example of the temperature-sensing circuit 115 of FIG. 1A. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131*b* and the voltage drop across the resistor R2. The bipolar transistor 133*a* has a larger area (by a factor N) than the transistor 133*b*. The PMOS transistors 131*a* and 131*b* are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131*a* and 131*b* and the current through the transistor 134 mirrors the current through the transistors 131*a* and 131*b*.

Figure 2:
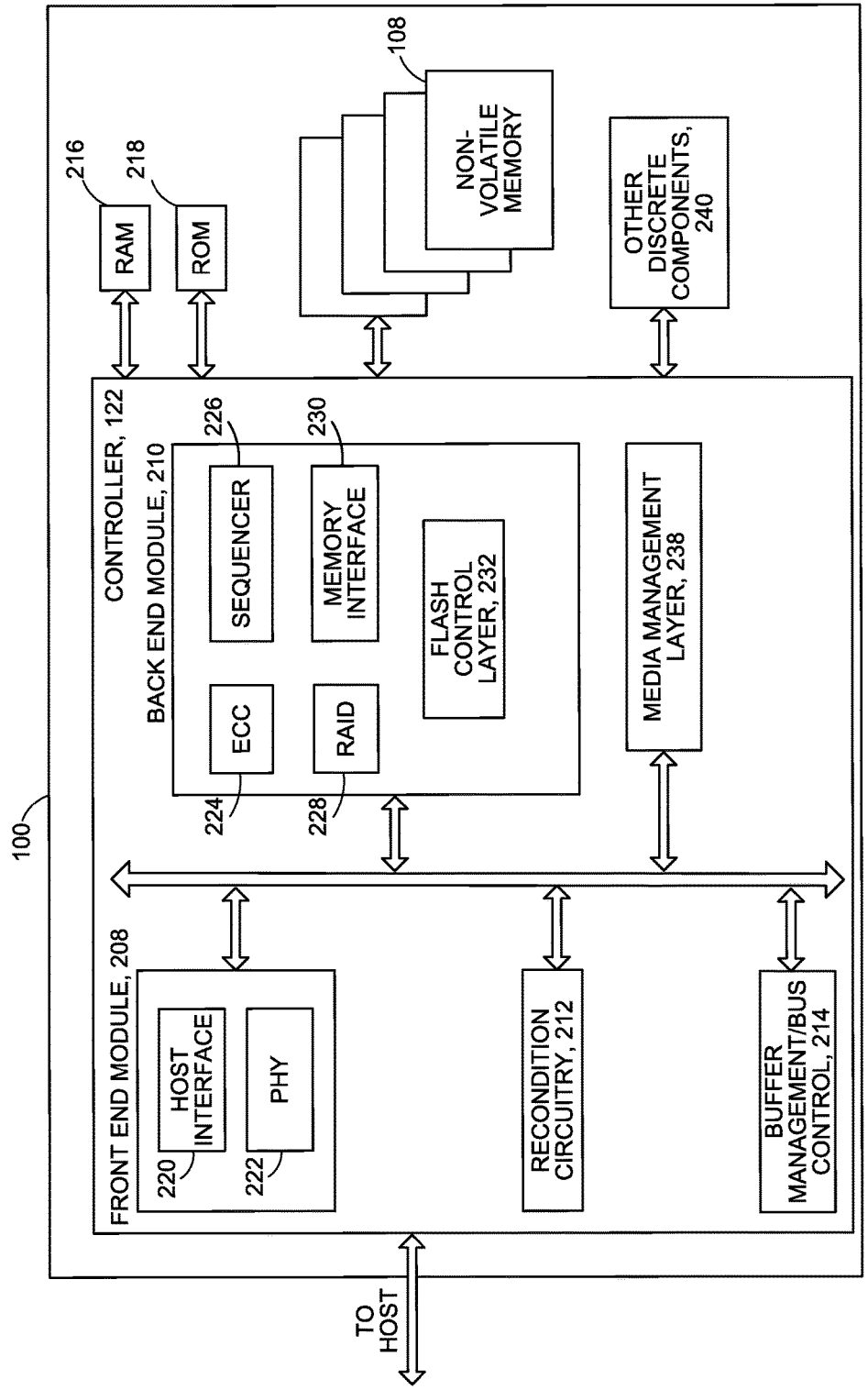
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
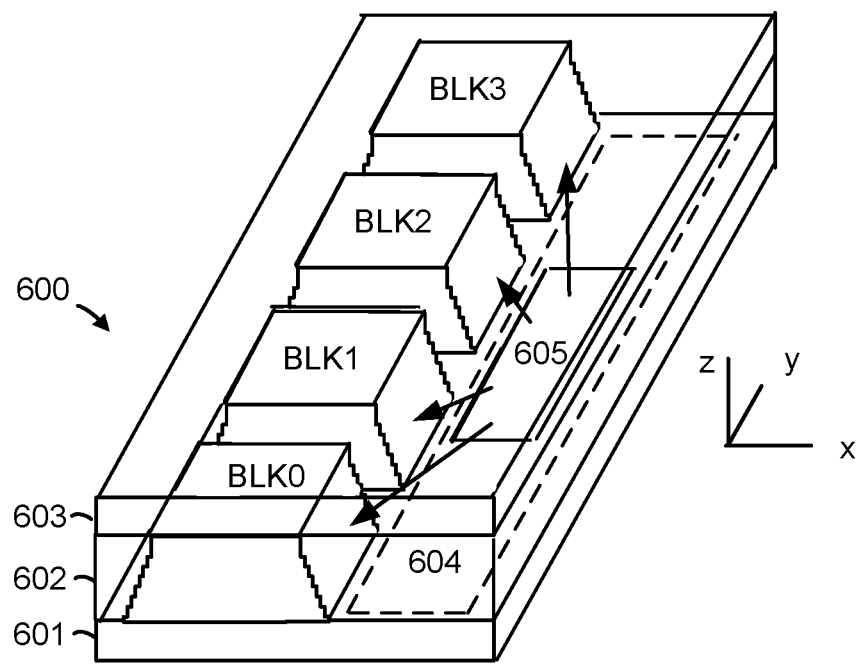
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
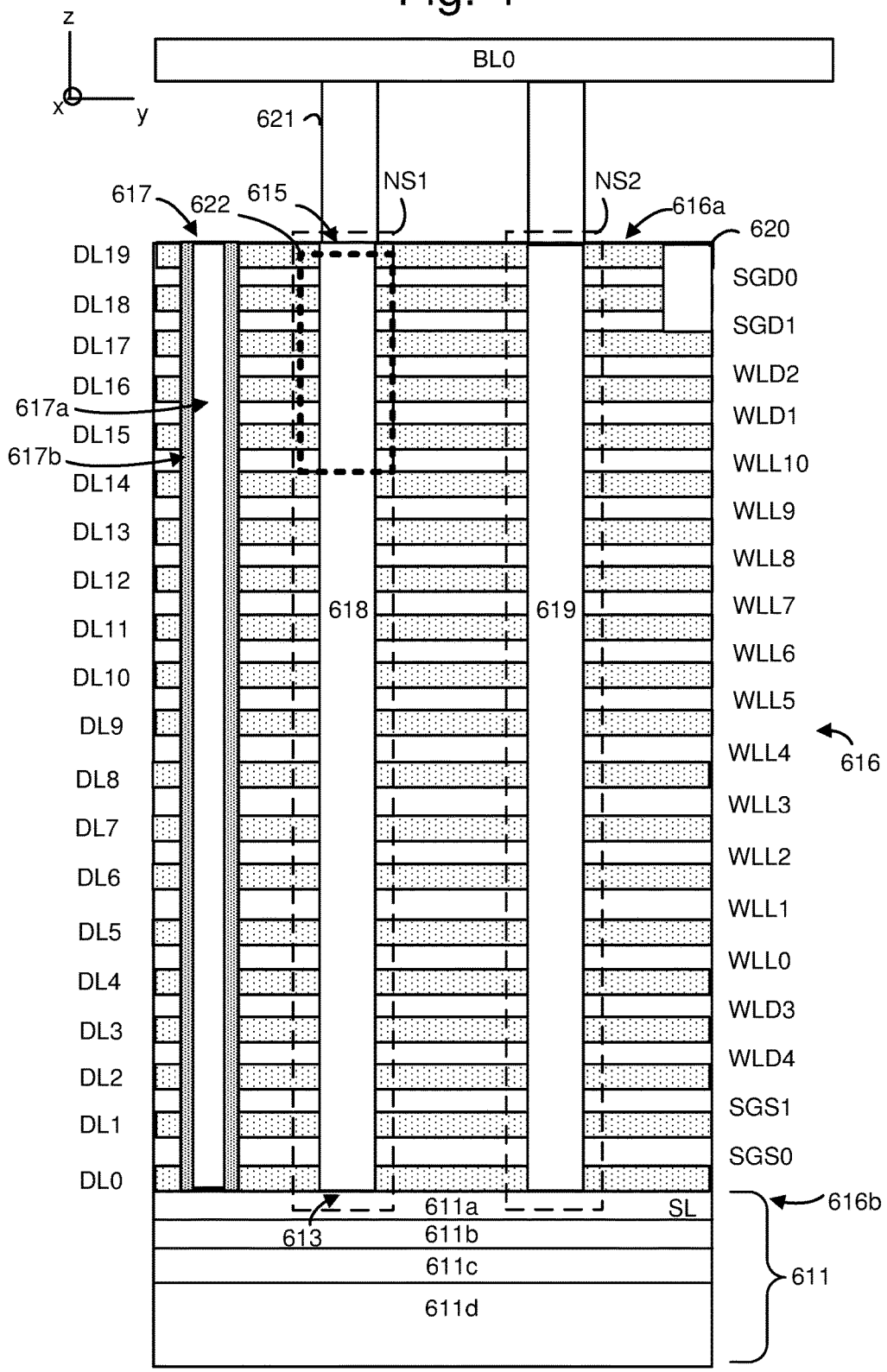
FIG. 4 depicts an example cross-sectional view of a portion of one of the blocks of FIG. 3.

FIG. 4 depicts an example cross-sectional view of a portion of one of the blocks of FIG. 3. The block comprises a stack 616 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack and a drain-end 615 at a top 616a of the stack. Local interconnects, such as local interconnect 617, may be provided periodically across the stack. The local interconnects may be metal-filled slits which extend through the stack, such as to connect the source line/substrate to a line above the stack. The slits may be used during the formation of the word lines and subsequently filled with metal. The local interconnect comprises a conductive region 617a (e.g., metal) within an insulating region 617b. A portion of a bit line BL0 is also depicted. A conductive via 621 connects the drain-end 615 of NS1 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

An insulating region 620 may be provided to separate portions of the SGD layers from one another to provide one independently driven SGD line per sub-block. In this example, the word line layers are common to two adjacent sub-blocks. See also FIG. 7B. In another possible implementation, the insulating region 620 extends down to the substrate to separate the word line layers. In this case, the word line layers are separate in each sub-block. Although, in either case, the word line layers of a block can be joined at their ends to one another so that they are commonly driven within a block, as depicted in FIG. 7B.

Figure 5:
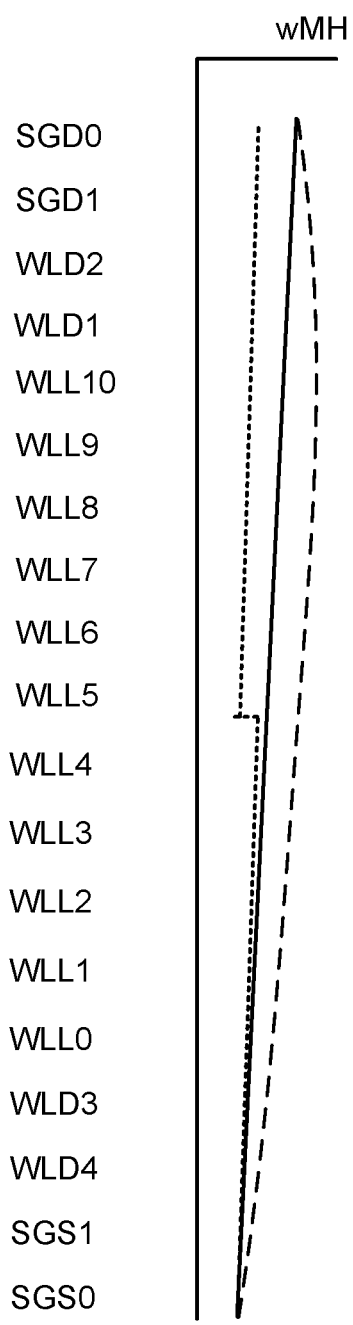
FIG. 5 depicts a plot of memory hole/pillar diameter in the stack of FIG. 4.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes. The amount of word line coupling up and discharge is therefore relatively larger than for memory cells in word lines adjacent to the relatively larger diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
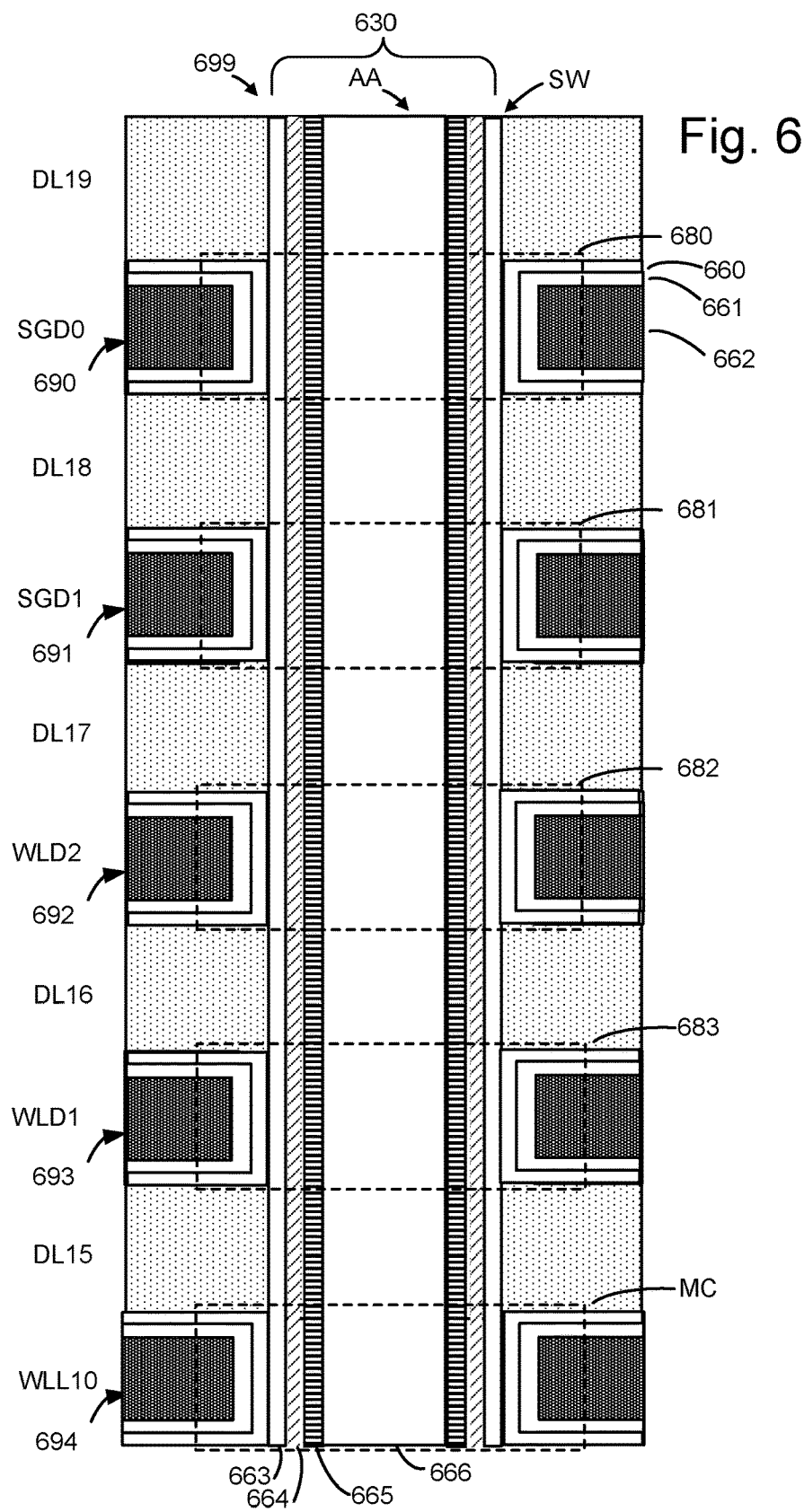
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664 (tunnel oxide), a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts an example view of NAND strings in sub-blocks in a 3D configuration which is consistent with FIG. 4. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings, e.g., vertical strings, which extend upward from a substrate.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

FIG. 7B depicts word line and SGD layers in an example set of blocks which is consistent with FIG. 4. Blocks BLK0, BLK1, BLK2 and BLK3 are depicted. The word line layers (WLL) in each block are depicted and long with example SGD lines. One SGD line is provided in each sub-block. BLK0 includes sub-blocks SB0, SB1, SB2 and SB3. Each circle represents a memory hole or string. The sub-blocks are elongated in the x direction and contain thousands of memory strings in practice. Additionally, many more blocks beyond those depicted are arranged in a row on the substrate. The word line layers and SGD/SGS layers may receive voltages from a row decoder 2401. See also FIGS. 24A and 24B.

FIG. 8A depicts an example Vth distribution of memory cells, where eight data states are used, in a first read condition compared to a second read condition. Eight data states are an example only as other numbers may be used such as four, sixteen or more. For the Er, A, B, C, D, E, F and G states, we have Vth distributions 820, 821, 822, 823, 824, 825, 826 and 827, respectively, in the second read condition, and 820a, 821a, 822a, 823a, 824a, 825a, 826a and 827a, respectively, in the first read condition. For the A, B, C, D, E, F and G states, we have program verify voltages VvA, VvB, VvC, VvD, VvE, VvF and VvG, respectively. Also depicted are read voltages VrAH, VrBH, VrCH, VrDH, VrEL, VrFL and VrGL, respectively, in the second read condition, and read voltages VrAL, VrBL, VrCL, VrDL, VrEH, VrFH and VrGH, respectively, in the first read condition. Also depicted is an example encoding of bits of 111, 110, 100, 000, 010, 011, 001 and 101, respectively. The bit format is: UP/MP/LP. An erase verify voltage VvEr is used during an erase operation.

This example indicates the shift in the Vth distribution for the first read condition compared to the second read condition is relatively larger when the data state is relatively lower or higher, than when the data state is mid-range. The shift may be progressively larger for progressively lower or higher data states. In one example, the read voltages of VrAL, VrBL, VrCL and VrDL are optimal for the relatively lower states of A, B, C and D, respectively, and the read voltages of VrEH, VrFH and VrGH are optimal for the relatively higher states of E, F and G, respectively, in the first read condition. Similarly, the read voltages of VrAH, VrBH, VrCH and VrDH are optimal for the relatively lower states of A, B, C and D, respectively, and the read voltages of VrEL, VrFL and VrGL are optimal for the relatively higher states of E, F and G, respectively, in the second read condition. Thus, the lower of two read voltages per state is optimal in the first read condition for the lower states and the higher of two read voltages per state is optimal in the first read condition for the higher states, in one possible implementation.

The optimum read voltages generally are midway between the Vth distributions of adjacent data states. Accordingly, as the Vth distribution shifts, the optimum read voltages shift.

The first read condition can occur when there is a long delay since a last programming or read operation. An example sequence is: program a block, wait for one hour, then read the block. The first read condition can also occur when there is a power down/power up. An example sequence is: program a block, power down/power up, then read the block. The first read condition can also occur when there is a program or read of other blocks. An example sequence is: program one block, program another block, then read the one block.

FIG. 8B depicts example bit sequences for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to 0 between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG. The read voltages are depicted as VrA, VrB, VrC, VrD, VrE, VrF and VrG, where each of these can represent the first or second read values, whichever is optimal.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 10A depicts a plot of example waveforms in a programming operation, showing coupling up of a word line voltage. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. The program voltage can temporarily pause at an intermediate level such as Vpass to avoid a single large transition which can have undesired coupling effects. A pass voltage 1005 is applied to the unselected word lines from t0-t19 and reaches a magnitude of Vpass, which is sufficiently high to provide the cells in a conductive state so that the sensing (e.g., verify) operations can occur for the cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, the decrease in Vpass will cause the cells to transition from a conductive state to a non-conductive state. In particular, when the Vpass falls below a cutoff level, Vcutoff (the dotted line at t18), the channel of the cell will become cutoff, e.g., the cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the cell (the word line voltage), Vth is the threshold voltage of the cell and Vsl is the source line voltage which in turn is approximately the voltage at the source terminal of the cell. For a cell in the highest programmed state, e.g., the G state, the Vth can be as low as VvG (or lower due to post-programming charge loss) and as high as the Vth at the upper tail of the G state in the Vth distribution 827 or 827a in FIG. 8A. Vcutoff can therefore be as low as VvG+Vsl or as high as Vth of G state upper tail+Vsl. As the pass voltage 1005 decreases from Vcutoff to 0 V, the channel is capacitively coupled down by a similar amount, as represented by plot 1015 in FIG. 10B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1012 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 10B depicts a plot of a channel voltage (Vch) corresponding to FIG. 10A. For an unselected memory string (a string not having a cell which is programmed in the current program loop), Vch will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected memory string (a string having a cell which is programmed in the current program loop), Vch is typically grounded as shown during the program voltage.

During the verify voltages, Vch may be initially at about 1 V, for instance, for a selected memory string. Vch is about the same as Vsl for the channels of the selected memory strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1012) are capacitively coupled higher by the increase in Vch. The voltages of the word lines float to a peak level of Vwl_coupled_up, thereby reaching the second read condition. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1−6×0.9=−4.4 V, for instance. Accordingly, there is a 4.4 V increase in Vch which is coupled to the word line, e.g., control gate, of the cells. Vwl_coupled_up may be about 4.4×0.9=4 V. The voltages of the word lines are floated by disconnected the word lines from a word line driver.

FIG. 10C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages 1115, 1116 and 1117 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1120 (at levels of VrAH and VrEL), 1121 (at levels of VrBH, VrDH and VrFL) and 1122 (at levels of VrCH and VrGL) for each of the lower, middle and upper pages, respectively, consistent with FIGS. 8A and 8B. The read voltages are optimized for the second read condition, as an example, and are applied to the selected word line. An eight-level memory device is used in this example.

For the unselected word lines, the decrease in Vpass will cause the cells to transition from a conductive state to a non-conductive state, as discussed. The dotted line at t13 indicates when a G state cell becomes non-conductive. As the pass voltage 1117 decreases from Vcutoff to 0 V, the channel is capacitively coupled down by a similar amount, as represented by the plot 1035 in FIG. 10D. As the channel voltage increases after t14, the word line voltages are floated and are coupled higher, to Vwl_coupled_up.

FIG. 10D depicts a plot of a channel voltage (Vch) corresponding to FIG. 10C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1032) are capacitively coupled higher by the increase in Vch (plot 1035). The voltages of the word lines float to a peak level of Vwl_coupled_up, as discussed.

FIG. 10E depicts the waveforms of FIG. 10C showing a decay of the coupled up voltage of the word line. The time scale is different than in FIGS. 10A-10D and represents a longer time period such as one or more hours. The plot 1123 depicts the read voltages (corresponding to the waveforms 1120-1122 in FIG. 10C) in a time period t041. The plot 1123a depicts the pass voltages (corresponding to the waveforms 1115-1117 in FIG. 10C). A plot 1125 depicts an increase in Vwl to a coupled up level (Vwl_coupled_up) due to coupling (in a time period t1-t2) followed by a decay of Vwl in a time period t2-t3. Generally, the increase in Vwl occurs relatively quickly compared to the time period of the decay.

FIG. 10F depicts a plot of a channel voltage consistent with FIG. 10E. A decrease is followed by an increase (plot 1126) in the time period t1-t2. Vch is about 0 V from t2-t3 (plot 1127).

FIG. 10G depicts a plot of a Vth of a memory cell connected to the coupled up word line, consistent with FIGS. 10E and 10F. For a cell in an example data state, such as the A state, the Vth is at an initial level, Vth_initial, from t0-t1. This represents the first read condition. Vth increases from t1-t2 (plot 1128) due to coupling at the same time as the increase in Vch, to a peak level of Vth_coupled_up. This represents the second read condition. The Vth then gradually decreases back to Vth_initial from t1-t3.

Figure 11A:
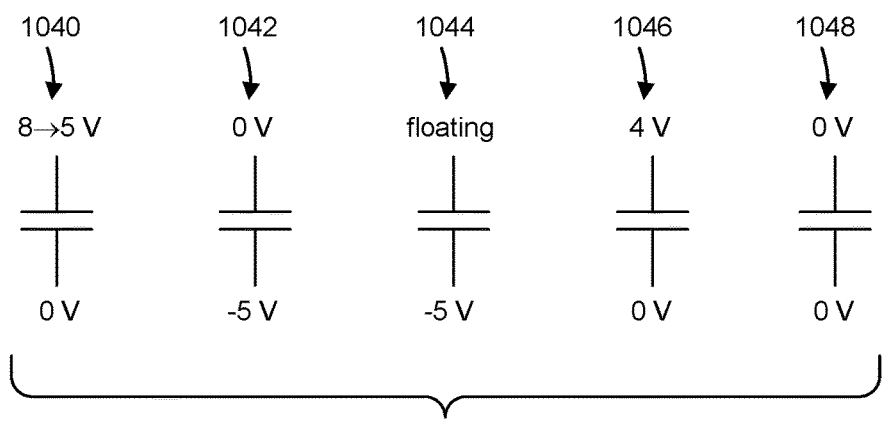
FIG. 11A depicts control gate and channel voltages on a memory cell which acts as a capacitor when the control gate voltage is decreased in a sensing operation.

FIG. 11A depicts control gate and channel voltages on a memory cell which acts as a capacitor when the control gate voltage is decreased in a sensing operation. The first read issue is caused by the stacking of word line planes or layers in 3D, where the channels of the memory cells are floating and not coupled to the substrate as in 2D Flash NAND architectures. Word line coupling and electron trapping in oxide-nitride-oxide (ONO) layers are the sources of the first read issue.

As discussed, after a read/verify operation, when the read pass voltage (Vpass) applied on a word line ramps down, the G-state cells, for example, with Vth of 5 V, cut off the channel when Vpass reduces to 5 V. The floating channel potential then is pushed down to a negative value when Vpass is further reduced to Vss. Next, the negative voltage in the channel shown above (about −4.5 V) increases after the read operation finishes by attracting positive charges.

Since the data word lines are floating, the amount of holes needed to charge up the channel is relatively small, so the selected and unselected word lines can be quickly coupled up to around 4 V (assuming a coupling ratio of 90%). The potential on the word lines remains at about 4 V for a while. This attracts and traps electron in the tunnel ONO layers and causes a Vth upshift or downshift for the lower or higher data states, respectively. The word line voltage thus rises to about 4 V after the read operation due to the coupling of the word line to the floating channel potential.

The top plate represents the control gate or word line and the bottom plate represents the channel. The capacitor 1040 represents a memory cell when the word line voltage decreases from 8 V (Vpass) to 5 V (Vcutoff such as VvG or slightly higher) and Vch=0 V V. The capacitor 1042 represents a memory cell when the word line voltage reaches 0 V, so that Vch is down coupled to about −4.5 V. The capacitor 1044 represents a memory cell when the associated word line voltage starts to float. The capacitor 1046 represents a memory cell when the associated word line voltage reaches Vwl_coupled_up in the second read condition. If the Vth of the memory cell is less than 4 V (e.g., the cell is in the erased state or lower programmed state), the memory cell will be weakly programmed so that its Vth increases. If the Vth of the memory cell is more than 4 V (e.g., the cell is in a higher programmed state), the memory cell will be weakly erased so that its Vth decreases. The capacitor 1048 represents a memory cell after a significant amount of time has passed, e.g., an hour or more such that the word line has discharged to the first read condition.

When a data word line voltage floats, the amount of holes needed to charge up the channel is relatively small. As a result, the selected word line can be relatively quickly coupled up to about 4 V, for example. The potential on the selected word line remains at about 4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read condition will occur again.

Figure 11B:
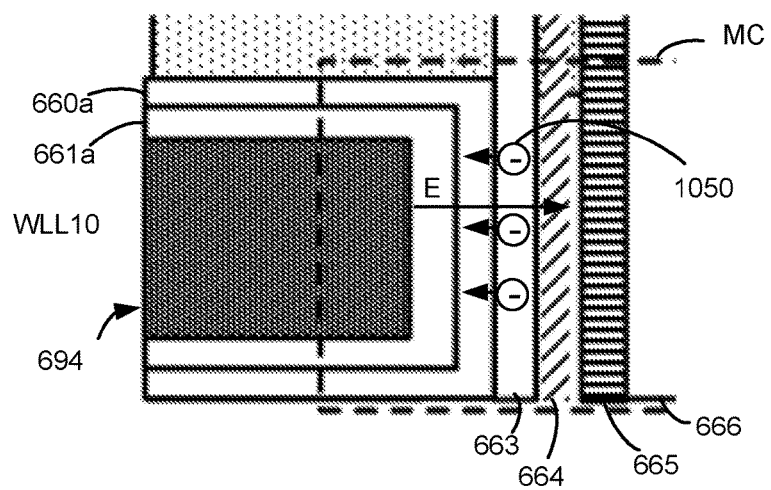
FIG. 11B depicts a portion of a memory cell, showing electron injection into a charge trapping region during weak programming.

FIG. 11B depicts a portion of the memory cell MC of FIG. 6 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps. A weak erasing similarly involves an electric field which repels electrons from the charge trapping layer, decreasing the Vth.

FIG. 12A depicts a configuration of an example memory string 1200 just before word lines are discharged at the end of a sensing operation. For example, this is just before the word line voltage begins to ramp down from Vpass, e.g., at t17 in FIG. 10A and t12 in FIG. 10C. As mentioned, the first read issue is caused by the high Vth cells (e.g., the G-state cells) cutting off the channel during the discharge of the word lines. Vch is coupled down by the discharging word lines. Subsequently, holes enter the channel to neutralize the channel voltage, e.g., Vch increases from a negative voltage to about 0 V. This increase couples up the word line voltage to about 4 V, for instance. This elevated word line voltage eventually causes electron trapping in the interface between the tunnel oxide and the polysilicon channel as well as charge redistribution in the charge trapping layers of the memory cells, increasing the Vth of some of the cells to the second read condition. After some time has passed, such as one or more hours, or if the word lines are exposed to a steady state voltage for some time, the word lines will eventually discharge back to about 0 V. This discharge is due to current leakage through the SGS transistors and into the substrate. The cells then return to the first read condition. The optimum read levels vary based on whether the cells are in the first or second read condition, or somewhere in between. A high number of read errors will result if the read levels are optimized for the first read condition and the second read condition is present, or if the read levels are optimized for the second read condition and the first read condition is present.

The memory string 1200 extends between a p-well 1205 and a bit line 1202 and includes memory cell control gates 1211, 1212, 1213, . . . , 1214 and 1215 between an SGS transistor control gate 1210 and an SGD transistor control gate 1216. The string includes a channel region 1204 within a memory film layer 1203 (e.g., a tunneling layer within a charge-trapping layer). A central dielectric core 1201 is also depicted. The string is shown in a cross-sectional view, where the control gates and layers wrap around the memory hole. Further, as an example, the memory cells having control gates 1211 and 1215 are programmed to the G state, the highest state in this example, and the memory cells having control gates 1212-1214 are in any state.

The SGD control gate is at a voltage of Vsgd, e.g., 3-4 V, the memory cell control gates 1211-1215 are at a voltage of Vpass, e.g., 8-10 V, the SGS control gate is at a voltage of Vsgs, e.g., 3-4 V, the p-well may be at 1 V (Vsl) and the bit line may be at 1-2 V. Example electrons ("e−") enter the channel from the bit line as a result of sense circuits being activated for the sensing operation. This results in a channel voltage of about 0 V. During the discharge or ramp down of the word lines, the G state cells cutoff (become non-conductive), causing the channel voltage to float and be down coupled, as mentioned.

FIG. 12B depicts a configuration of an example memory string just after word lines are discharged at the end of a sensing operation. At this point, the channel voltage is negative (Vch<0 V), as represented by the reduced number of electrons, and each of the control gates reaches 0 V. The bit line voltage may also be set to 0 V.

FIG. 12C depicts a configuration of an example memory string when word lines are coupled up by the channel. The negative channel voltage causes a lateral field across the SGS transistor which results in holes gradually entering the channel from the p-well. The holes neutralize the field across the SGS transistor and combine with the electrons, gradually causing the channel voltage to increase toward 0 V. At this time, the word line voltages are floating so that they are coupled up as Vch increases. This is indicated by the notation "floating higher."

FIG. 12D depicts a configuration of an example memory string when word lines have completed coupling up. In this case, the channel is fully neutralize so that Vch=0 V. The word line voltages are at a coupled up level of about 4 V, for instance.

Figure 13A:
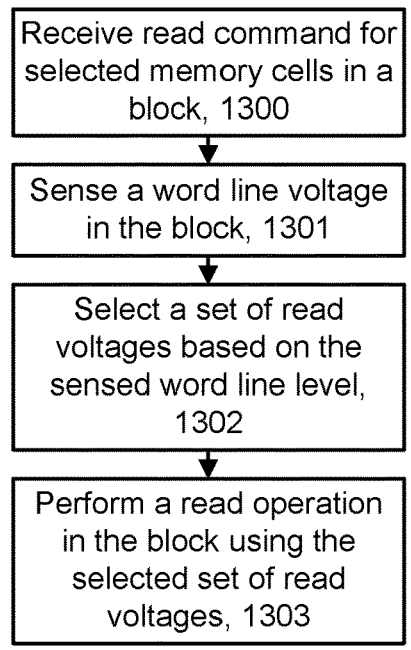
FIG. 13A depicts an example process consistent with block 10 in FIG. 1C.

FIG. 13A depicts an example process consistent with block 10 in FIG. 1C. This feature includes detecting a coupled up state of word lines and setting read voltages accordingly. Step 1300 includes receiving a read command for selected memory cells, e.g., connected to a selected word line, in a block. For example, the command may be received at the controller 122 from the host. In other cases, the read command is generated internally within the memory device 100 (FIG. 1A). Step 1301 includes sensing a word line voltage in the block. In one approach, the sensed word line is predetermined in the block and is not necessarily the same as the selected word line which is connected to the selected memory cells. Sensing of one or more word lines is possible. For example, a voltage detector may be configured to perform an evaluation of a voltage of one or more word lines. See FIG. 24B for further example details. Step 1302 includes selecting a set of read voltages based on the sensed word line level. The sensed word line level indicates whether the memory cells are in a first read condition, a second read condition, or somewhere in between. See, e.g., FIG. 13B-13D. Step 1303 includes performing a read operation in the block using the selected set of read voltages. In this approach, an optimum set of read voltages which minimizes read errors can be selected based on the current coupled up state of the word lines.

Figure 13B:
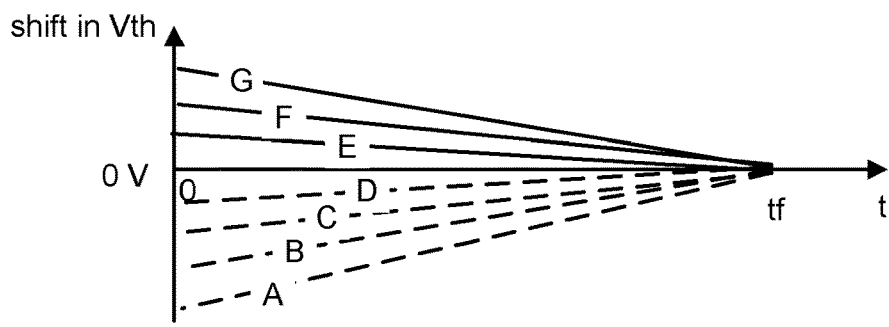
FIG. 13B depicts a plot of a shift in Vth for different data states versus time.

FIG. 13B depicts a plot of a shift in Vth for different data states versus time. As mentioned, in a first read condition, a Vth downshift may be seen for one or more lower states, essentially no change in Vth may be seen in one or more midrange states, and a Vth upshift may be seen for one or more upper states. These shifts are relative to Vth levels in the second read condition.

The time t=0 represents the time of a sensing operation while the cells are in the first read condition. The shift in read voltage is largest in magnitude at this time since the word lines are discharged and the Vth of the cells is relatively far from the Vth of the second read condition for each programmed data state. The shift decreases gradually in magnitude as time progresses from 0 to tf. At tf, a shift of 0 V may be realized, in one approach. Separate plots are provided for the programmed states labelled as A, B, C, D, E, F and G, where the plots for A, B, C, D show a downshift and the plots for E, F and G show an upshift. This example shows eight data states, but a similar trend may be seen for other numbers of data states.

FIG. 13C depicts a plot showing a trend of read voltage versus a detected word line voltage. The horizontal axis depicts a word line (WL) voltage which can be sensed using circuitry such as shown in FIG. 24B. The vertical axis depicts read voltages consistent with FIG. 8A, including a lower and higher read voltage for each programmed data state. The plots show that the read voltage increases with the sensed WL voltage for the lower data states and decreases with the sensed WL voltage for the higher data states.

FIG. 13D depicts a plot of read voltage versus a detected word line voltage, where two sets of read voltages are used in an example implementation of FIG. 13C. In a simplified implementation, the sensed WL voltage is classified into one of two ranges: below a reference voltage (Vref) or above Vref. If the sensed WL voltage is above Vref, the read voltages VrAH, VrBH, VrCH, VrDH, VrEL, VrFL and VrGL are selected. If the sensed WL voltage is below Vref, the read voltages VrAL, VrBL, VrCL, VrDL, VrEH, VrFH and VrGH are selected. Vref may be selected based on the maximum coupled up word line voltage, in one approach. For example, if the maximum coupled up word line voltage is about 4 V, Vref may be about one-half of that, or 2 V.

Figure 13E:
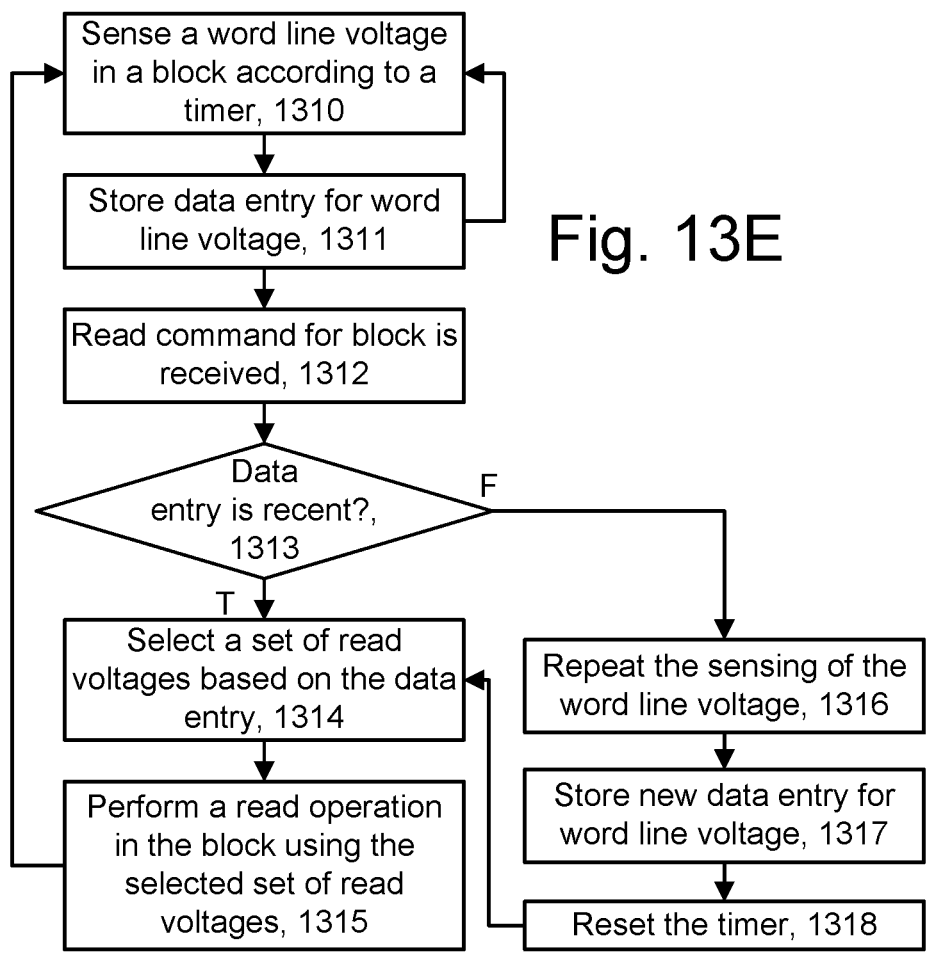
FIG. 13E depicts another example process consistent with block 10 in FIG. 1C.

FIG. 13E depicts another example process consistent with block 10 in FIG. 1C. As an alternative to FIG. 13A, this process involves a periodic polling of a block to determine its word line voltage. This process is useful because it can store a data entry for a word line voltage before a read command is received. When the read command is received, the appropriate read voltages can be determined immediately without performing another word line voltage detection. A check can be made as to whether the detected word line voltage is sufficiently recent so that it can be relied on in selecting the read voltages.

Step 1310 includes sensing a word line voltage according to a timer. For example, this can be done periodically, e.g., every few minutes or hours. Step 1311 includes storing a data entry for the word line voltage. If no read command is received before the time of the next sensing, steps 1310 and 1311 are repeated. If a read command for the block is received at step 1312, a decision step 1313 determines whether the data entry is recent, e.g., no older than a specified amount of time. If decision step 1313 is true, step 1314 selects a set of read voltages based on the data entry and step 1315 performs a read operation in the block using the set of read voltages. The process then continues at step 1310. If decision step 1313 is false, step 1316 repeats the sensing of the word line voltage, step 1317 stores a new data entry for the word line voltage and step 1318 resets the timer. Steps 1314 and 1315 are then reached.

Optionally, the decision step 1313 is omitted so that the most recent entry is always used to select the read voltages. The period for the word line detection can be set to be sufficiently short so that the most recent entry is valid.

Figure 14A:
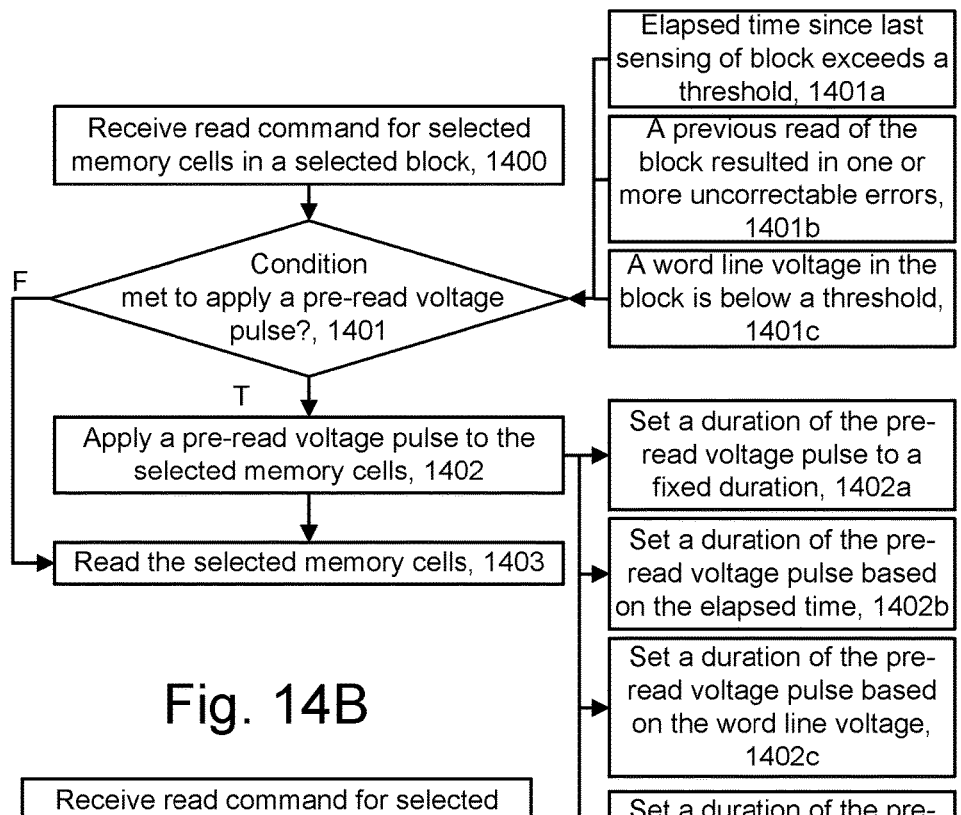
FIG. 14A depicts an example process consistent with block 11 in FIG. 1C.

FIG. 14A depicts an example process consistent with block 11 in FIG. 1C. This feature includes applying a pre-read voltage pulse just prior to a read operation. Step 1400 includes receiving a read command for selected memory cells, e.g., connected to a selected word line, in a selected block. A decision step 1401 determines whether a condition is met to apply a pre-read voltage pulse to the selected word line. This decision step can consider various data inputs. For example, block 1401a indicates whether an elapsed time since a last sensing of the block exceeds a threshold. The threshold may be long enough such that the cells will be in the first read condition if the elapsed time exceeds the threshold. The condition may be met if the input of block 1401a is received. Block 1401b indicates whether a previous read of the block results in one or more uncorrectable errors. This previous read may be associated with a previous read command other than the one referred to in step 1400. A read recovery processed may have been used to read the data in response to the one or more uncorrectable errors in the previous read. The condition may be met if the input of block 1401b is received.

A control circuit may be configured to cause a voltage detector to perform the evaluation in response to a determination that a previous read of memory cells in the block resulted in one or more uncorrectable errors.

Block 1401c indicates whether a word line voltage in the block is below a threshold. The threshold may be low enough such that the cells will be in the first read condition if the word line voltage is below the threshold. The word line voltage may be sensed using techniques discussed in connection with FIGS. 13A and 24B. The condition may be met if the input of block 1401c is received.

If decision step 1401 is true, step 1402 includes applying a pre-read voltage pulse to the selected word line and step 1403 includes reading the selected memory cells. See FIGS. 15A and 15B. In one implementation, the pre-read voltage pulse is applied to the selected word line but not the remaining, unselected word lines in the selected block. In another implementation, the pre-read voltage pulse is also applied concurrently to some or all of the unselected word lines. The pre-read voltage pulse provides a weak or soft programming for cells, particularly those in the lower programmed states. The pulse generates an electric field across the cells which causes some charge trapping and therefore some increase in Vth, in proportion to the duration and magnitude of the pulse. The pulse may not increase the Vth for cells in the higher states, depending on the pulse magnitude and duration.

In one option, step 1402a includes setting a duration of the pre-read voltage pulse to a fixed duration. The magnitude of the pre-read voltage pulse can also be set to a fixed magnitude. In another option, step 1402b includes setting a duration of the pre-read voltage pulse based on the elapsed time. The magnitude of the pre-read voltage pulse can also be set based on the elapsed time. See FIG. 15C. Step 1402c includes setting a duration of the pre-read voltage pulse based on the detected word line voltage. The magnitude of the pre-read voltage pulse can also be set based on the detected word line voltage. See FIG. 15D. Step 1402d includes setting a duration of the pre-read voltage pulse based on temperature. The magnitude of the pre-read voltage pulse can also be set based on the sensed temperature. See FIG. 15E.

If the read voltages are optimized for the second read condition, the pre-read voltage pulse is helpful in increasing the Vth of the cells back to the second read condition before reading them.

Figure 14B:
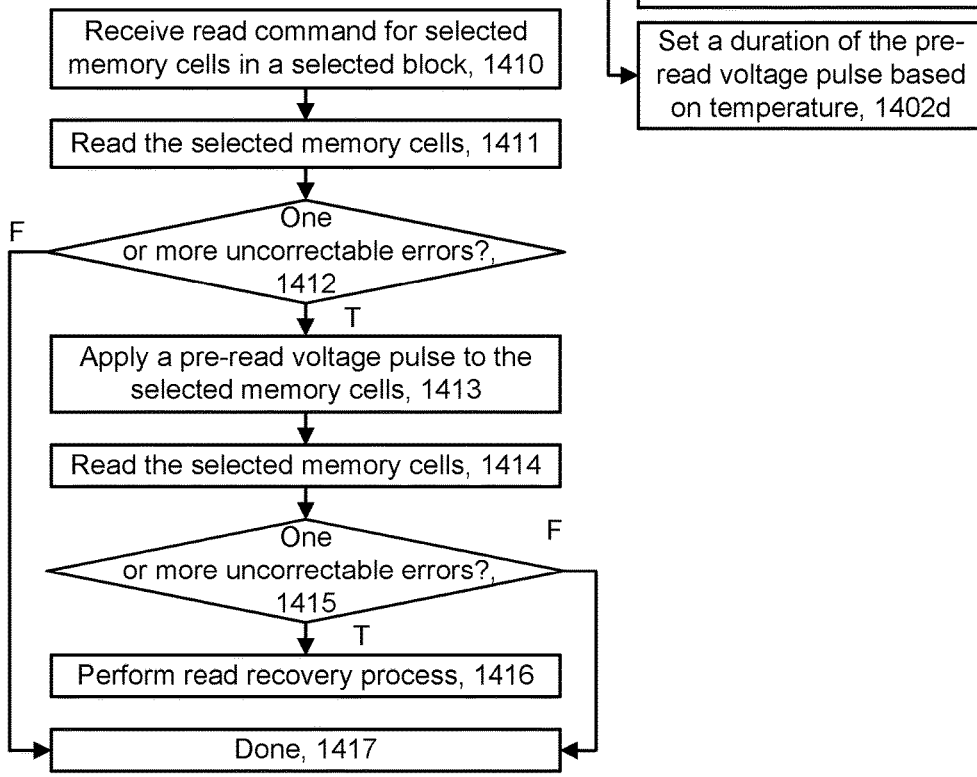
FIG. 14B depicts another example process consistent with block 11 in FIG. 1C.

FIG. 14B depicts another example process consistent with block 11 in FIG. 1C. In this case, the pre-read voltage pulse is not applied unless there are one or more uncorrectable errors for an initial read. Step 1410 includes receiving a read command for selected memory cells. Step 1411 includes reading the selected memory cells. In one approach, the default read levels which are optimized for the second read condition are used. A decision step 1412 determines whether there are one or more uncorrectable errors, e.g., whether the ECC process cannot correct all read errors. If decision step 1412 is false, the read process is done at step 1417. If decision step 1412 is true, step 1413 includes applying a pre-read voltage pulse to the selected word line. Step 1414 then reads the selected memory cells again, and a decision step 1415 determines whether there are still one or more uncorrectable errors. If decision step 1415 is false, the read process is done at step 1417. If decision step 1415 is true, step 1416 includes performing a read recovery process. This can involve repeated read attempts in which the read voltage is shifted higher and/or lower.

Optionally, if decision step 1415 is true, a second pre-read voltage pulse can be applied. The magnitude and/or duration of the second pre-read voltage pulse can be greater than for the first application of the pre-read voltage pulse.

The initial read which results in uncorrectable errors would have some effect in coupling up the word line voltages if the word line voltages were floated for a sufficiently long time. However, this would extend the read operation time excessively. The soft programming of the pre-read voltage pulse acts more quickly than the word line coupling up in increasing the Vth of the cells. Further, the pre-read voltage pulse may act on the selected word line rather than all word lines in a block.

FIG. 15A depicts a plot of example waveforms in a read operation similar to FIG. 10C, where a pre-read voltage pulse is applied before the read operation. The waveforms 1115-1117 and 1120-1122 of FIG. 10C are repeated. A pre-read voltage pulse (plot 1500) is applied just before the read waveforms. The pre-read voltage pulse can have a magnitude of Vpass, for example. Generally, the pulse will have greater effect in increasing the Vth of the cells when it has a greater magnitude and/or duration. The pre-read voltage pulse ramps up starting at t0a, e.g., in response to a read command, and ramps down starting at t0b so that the duration is t0b-t0a. After it ramps down to 0 V, for example, the read operation begins at t0. The delay between the pre-read voltage pulse and the read operation can be minimized to minimize the overall read time. The pre-read voltage pulse helps increase the Vth of the cells before they are read to reduce read errors. The coupling up of the word lines after the read operation can also be performed as indicated by the plot 1032.

Plot 1500a shows an option for the pre-read voltage pulse which can reduce power consumption. In this example, the ramp up rate for the pre-read voltage pulse can be less than the ramp up rate for the subsequent pass voltages during the read operation.

FIG. 15B depicts a plot of a channel voltage (Vch) corresponding to FIG. 15A. The plot 1035a corresponds to the plot 1035 of FIG. 10C.

Figure 15C:
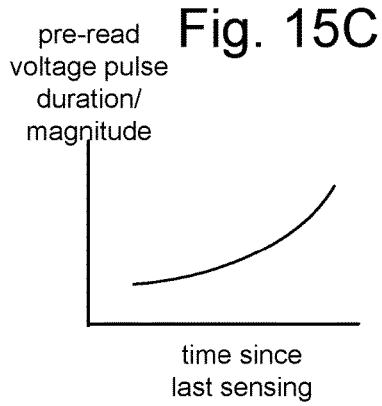
FIG. 15C depicts a plot of pre-read voltage pulse duration versus a time since a last sensing operation, consistent with step 1402b of the process of FIG. 14A.

FIG. 15C depicts a plot of pre-read voltage pulse duration and/or magnitude versus a time since a last sensing operation, consistent with step 1402b of the process of FIG. 14A. This may be a time since a last read operation or a programming operation which comprises a verify test. The duration and/or magnitude increases as the time increases since the pre-read voltage pulse helps increase the Vth of the memory cells, where the Vth decreases over time due to discharging of the word line voltages. The effect of the pre-read voltage pulse is greater when the duration and/or magnitude is greater. The duration could be about 0.1 msec-200 msec., for instance.

Figure 15E:
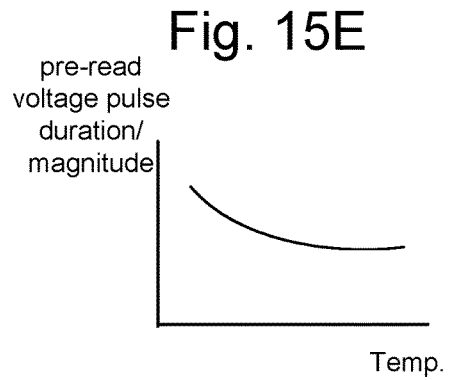
FIG. 15E depicts a plot of pre-read voltage pulse duration versus temperature, consistent with step 1402d of the process of FIG. 14A.
Figure 15D:
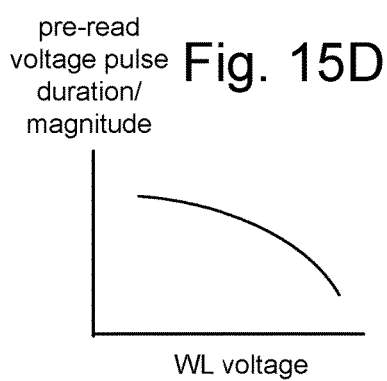
FIG. 15D depicts a plot of pre-read voltage pulse duration versus a detected word line voltage, consistent with step 1402c of the process of FIG. 14A.

FIG. 15D depicts a plot of pre-read voltage pulse duration and/or magnitude versus a detected word line voltage, consistent with step 1402c of the process of FIG. 14A. The duration and/or magnitude increases as the detected WL voltage decreases since a lower WL voltage indicates the word line voltage has discharged and the cells are in, or close to, the first read condition. A stronger (longer or larger magnitude) pre-read voltage is therefore indicated to help increase the Vth of the memory cells back toward the second read condition.

FIG. 15E depicts a plot of pre-read voltage pulse duration and/or magnitude versus temperature, consistent with step 1402d of the process of FIG. 14A. That is, the pulse duration and/or magnitude is inversely proportional to temperature. The temperature sensor 115 of FIG. 1A may be used to determine the temperature. Generally, at lower temperatures, we need a longer pulse duration and/or magnitude. In case of pre-read (which is done just before a read operation), we want to trap up electrons using the pre-read pulse, such that a memory cell enters the second read state. The time needed to trap electrons and transition the memory cell from the first read state to the second read state increases at lower temperatures. A mechanism is believed to involve hopping between trap-sites which is slower at lower temperatures. Thus, a longer pulse duration and/or magnitude is preferred at lower temperatures.

Figure 15F:
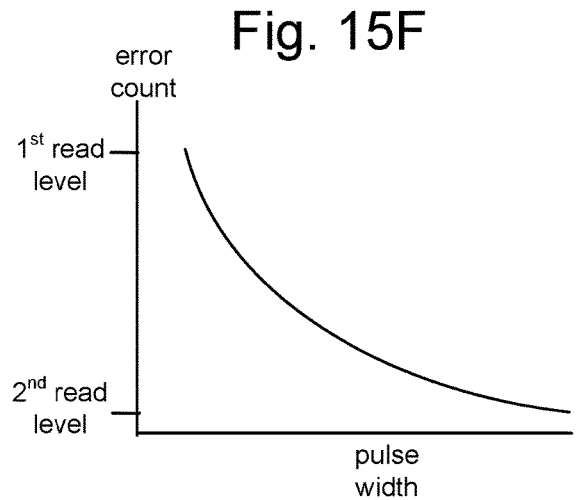
FIG. 15F depicts a plot of error count versus program pulse width, consistent with the process of FIG. 14A.

FIG. 15F depicts a plot of error count versus program pulse width on a log-log scale, consistent with the process of FIG. 14A. The plot was obtained by reading cells in the first read condition. It can be seen that if the pulse duration is very short, such as a few nanoseconds, it does not significantly reduce the error count, and the error count is as expected when the cells are in the first read condition. However, as the pulse duration increases, such as to a few milliseconds, the error count is significantly reduced to a level which is as expected when the cells are in the second read condition. The read voltages are optimized for the second read condition in this example.

Figure 16A:
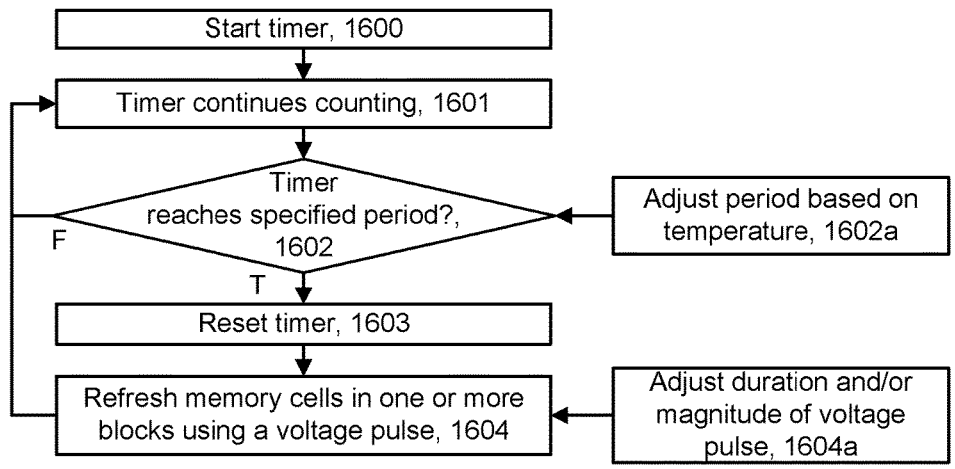
FIG. 16A depicts an example process consistent with block 12 in FIG. 1C.

FIG. 16A depicts an example process consistent with block 12 in FIG. 1C. This feature includes periodically applying a voltage pulse to all word lines in block. This process may use a voltage pulse which is similar to the pre-read voltage pulse. This process may apply the voltage pulse to all word lines in one or more block rather than just to a selected word line, in one approach. The process may be performed independently of a read command. A command may be defined in the controller which cause the pulse to be issued periodically. When the command is executed, the voltage drivers and associated pass gates (FIGS. 24A and 24B) are configured to concurrently apply a voltage pulse to all word lines in one or more blocks, in one approach. Another approach is to concurrently apply a voltage pulse to one or more word lines in one or more blocks.

It is also possible to stagger the voltage pulses within one die so that they are applied to different sets of blocks at different times. This reduces the peak current consumption. For example, if the blocks are arranged in multiple planes (e.g., different p-well regions of the substrate), the pulse can be applied to the blocks in one plane at a time. Or, depending on the memory device architecture, the pulse may be applied to a portion of the blocks in one plane at a time. The pulse may be applied to one set of blocks at a time, where each set comprises one or more blocks.

Figure 25:
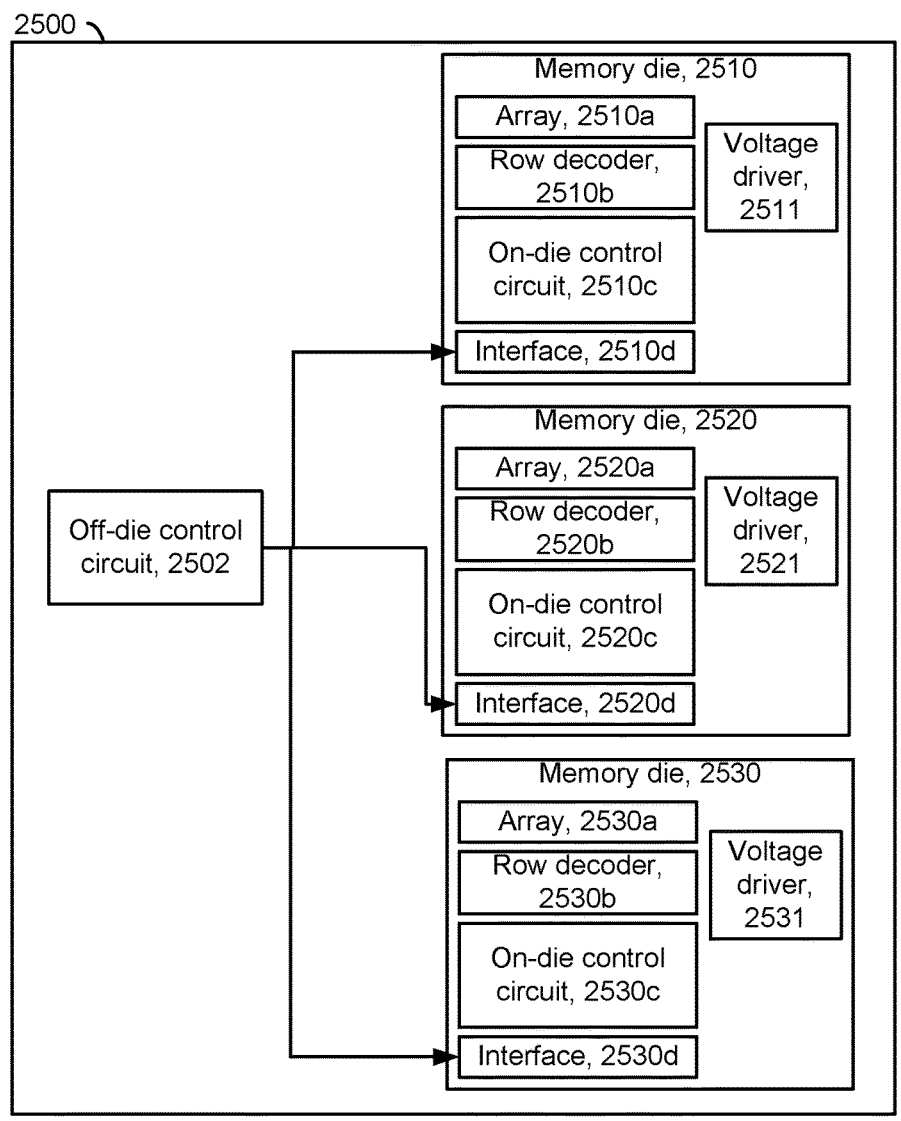
FIG. 25 depicts a memory device 2500 in which a voltage pulse is performed for multiple die, one die at a time, consistent with the process of FIG. 16A.

In another option which reduces the peak current consumption, depicted in FIG. 25, it is possible to stagger the voltage pulses across multiple die in a multi-die memory device.

Further, the current consumption can be reduced by setting Vbl=Vsource with the SGS and SGD transistors in a conductive state. This will tend to prevent current flowing in the string, since both ends of the string are at the same potential. Another approach is to cutoff the SGD or SGS transistors (but not both) so there is no current passing through them. One of the SGS or SGD transistors should be conductive so that the channel voltage is not floating.

The pulse can be issued periodically, such as about once per every several minutes or once per hour. The term "periodic" is meant to include fixed intervals as well as varying intervals. The pulse causes the blocks to return to the second read condition, in case the word lines have begun to discharge. The pulse can be implemented without keeping track of whether the blocks are in the first or second read condition. In some cases, a block may already be in the second read condition due to a recent sensing operation when the pulse is applied. The pulse may have little or no effect in this case. In other cases, a block may be in or close to the first read condition. The pulse may have a significant effect in this case in returning the block to the second read condition. The periodic issuing of the pulse can be started in response to a power on event in the memory device, in one approach. This event forces all of the word lines to 0 V and into the first read condition.

Step 1600 starts a timer. At step 1601, the timer continues counting. A decision step 1602 determines whether the timer has counted up to a specified period. Block 1602a indicates that the period can be adjusted based on the temperature, e.g., such that the period is shorter when the temperature is higher. See FIG. 16D. If decision step 1602 is false, step 1601 is repeated and the timer continues counting up. If decision step 1602 is true, step 1603 resets the timer and step 1604 includes refreshing memory cells in one or more blocks using a voltage pulse. The refreshing involves increasing the Vth of at least the lower state cells back to the second read condition. Block 1604a indicates that the duration and/or magnitude of the voltage pulse can be adjusted. For example, the adjustment can be made based on time since last sensing, WL voltage and temperature, as discussed in connection with FIG. 15C-15E, respectively.

FIG. 16B depicts a plot of periodic voltage pulses consistent with the process of FIG. 16A. The vertical axis depicts voltage and the horizontal axis depicts time. The example pulses 1610, 1620 and 1630 have a duration represented by an arrow 1625 and a period represented by an arrow 1626. In between the pulses, the word line voltage may be coupled up and then begin to decay as depicted by plots 1611, 1621 and 1631. Other operations which involve applying voltages to the word lines, such as read and program operations, may occur between the periodic voltage pulses. In the example provided, each voltage pulse has a common duration. In another approach, the duration can vary. Also, in the example provided, the voltage pulses are provide using a common period, e.g., time between pulses. In another approach, the period can vary.

FIG. 16C depicts a plot of channel voltage consistent with FIG. 16B. The channel voltage may be coupled lower and then increase, causing coupling up of the word lines, as discussed. For example, the pulse 1610 is ramped up at t0 and ramped down at t1, causing a down spike in Vch as depicted by plot 1616. The pulse 1620 is ramped up at t3 and ramped down at t4, causing a down spike in Vch as depicted by plot 1627. The pulse 1630 is ramped up at t6 and ramped down at t7, causing a down spike in Vch as depicted by plot 1636. The word line voltage is coupled up starting at t2, t5 and t8.

Figure 16D:
FIG. 16D depicts a plot of pulse period versus temperature, consistent with block 1602a of FIG. 16A.

FIG. 16D depicts a plot of pulse period versus temperature, consistent with block 1602a of FIG. 16A. As mentioned, the period can be shorter when the temperature is higher. A high temperature represents a worst case situation, where the discharge rate of the word line is greatest. In one approach, the period is set to a few minutes, e.g., 1-10 minutes, for example, for temperatures above room temperature, and to 1-2 hours for room temperature or lower.

Figure 17A:
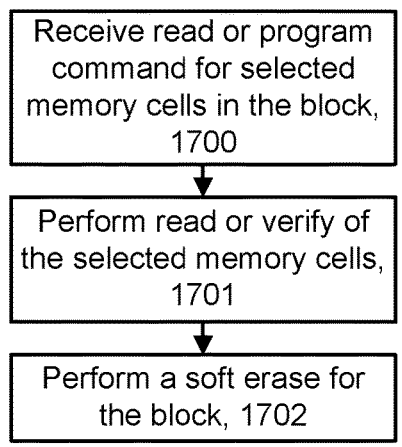
FIG. 17A depicts an example process consistent with block 13 in FIG. 1C.

FIG. 17A depicts an example process consistent with block 13 in FIG. 1C. This feature includes performing a soft erase just after a read or programming operation (block 13). As mentioned, after a sensing operation, e.g., a read or verify test, the word line voltages are coupled up by the channel if the word line voltages are floated. Step 1700 includes receiving a read or program command for selected memory cells, e.g., connected to a selected word line, in a block. Step 1701 includes performing a read or verify of the selected memory cells. The verify operation is performed in connection with a programming operation as discussed, e.g., in connection with FIG. 9. Step 1702 includes performing a soft erase for the block.

Figure 17B:
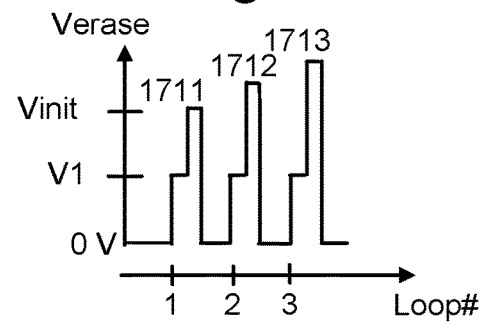
FIG. 17B depicts a plot of example erase voltages applied to a substrate in a normal erase operation.
Figure 17C:
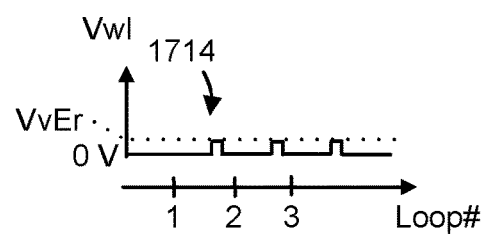
FIG. 17C depicts a plot of verify voltages applied to word lines in a block, consistent with FIG. 17B.

Prior to receiving a read command, the block was subject to a normal erase operation, such as depicted in FIGS. 17B and 17C, followed by a programming operation, such as depicted in FIG. 9. Prior to receiving a programming command, the block was subject to a normal erase operation.

FIG. 17B depicts a plot of example erase voltages applied to a substrate in a normal erase operation. The vertical axis depicts Verase and the horizontal axis depicts the erase loop number. Verase has an initial magnitude of Vinit and steps up in magnitude in each successive erase loop. A total of three loops are used to complete the erase operation in this example. Erase voltages 1711, 1712 and 1713 are applied in the erase loops 1, 2 and 3, respectively. Verase is the voltage applied to the substrate (p-well) via the local interconnect, for instance. Verase may have a magnitude of up to 20-25 V, for instance.

FIG. 17C depicts a plot of verify voltages applied to word lines in a block, consistent with FIG. 17B. The vertical axis depicts Vwl (word line voltage) and the horizontal axis depicts the erase loop number. An example erase verify voltage 1714 is depicted. This voltage (VvEr) may have a magnitude near 0 V, for example. An erase verify voltage is typically applied after each erase voltage as part of an erase verify test of a block.

FIG. 18A depicts a configuration of the example memory string 1200 of FIG. 12A when holes are introduced into the channel from the substrate and the channel starts to neutralize in a soft erase operation consistent with step 1702 of FIG. 17. After the configuration of FIG. 12A, the p-well voltage is raised to 5 V, for instance, to cause holes ("h+") to enter the channel from the substrate to start to neutralize the channel voltage. See also FIG. 19A-19D. The control gate of the SGS transistor may be set to 0 V, for instance, so that the transistor is in a conductive state for holes.

The electrons begin to combine with the holes as denoted by the reduced number of electrons compared to FIG. 12A. The word lines may be driven at 0 V during this time so that they are not coupled up. The control gate of the SGD transistor may also be driven at 0 V. This process is referred to as a soft erase because it is similar to what occurs in a normal erase operation but to a smaller degree. For example, in a normal erase operation, such as depicted in FIGS. 17B and 17C, the p-well may be raised to a much higher voltage of 20-25 V, for instance. A normal erase operation provides a sufficiently high channel-to-gate voltage which drives electrons out of the charge trapping layer of the cells and lowers the Vth of the programmed cells to the Vth level of the erased state. Typically, in the normal erase operation, the cells are erased in multiple iterations. Each iteration involves applying a p-well voltage followed by performing a verify test using the verify level VvEr (FIG. 8A). The soft erase differs in that the channel-to-gate voltage is not sufficiently high to erase the cells. Further, there is typically no verify test or use of multiple iterations. Further, the duration of the erase voltage on the p-well during the soft erase may be less than during a normal erase. The soft erase provides a channel-to-gate voltage which is sufficient to neutralize the channel without erasing the memory cells.

In one approach, the magnitude of the p-well voltage for the soft erase is less than 25-50% of the magnitude of the normal erase, and/or the duration of the p-well voltage for the soft erase is less than 25-50% of the duration of the normal erase.

FIG. 18B depicts a configuration of an example memory string when the channel is fully neutralized in a soft erase operation consistent with step 1702 of FIGS. 17 and 18A. The channel is fully neutralized so that Vch=0 V. The word line voltages are floating but remain at about 0 V since there is no coupling up from the channel.

FIG. 19A-19D depicts example waveforms in a read operation which is followed by a soft erase, consistent with FIG. 17.

FIG. 19A depicts a plot of example waveforms in a read operation which is followed by a soft erase. FIG. 19B depicts a channel voltage during a soft erase. FIG. 19C depicts an SGS transistor voltage during a soft erase. FIG. 19D depicts a p-well voltage during a soft erase. The waveforms 1115-1117 and 1120-1122 of FIG. 10C are repeated. The soft erase occurs from t14-t16 as the p-well voltage Vp-well is increased (plot 1930). The word lines are driven at 0 V, for example, (a lower level than the pass voltage) during the soft erase (plot 1033) so that the word line voltages do not float higher as Vch increases. Subsequently, after t17, the word line voltages may be floated (plot 1034). Although the word line voltage is floated at this time, it does not float to a higher level because the channel voltage has reached an equilibrium condition (Vch=0 V). Plot 1910 represents the channel voltage which is coupled down starting at t13 and gradually returns to 0 V at t15. A time margin of t16-t15 is provided to ensure that the channel voltage has completed its transition before Vp-well is ramped back down to 0 V from t16-t17. Vsgs (plot 1920) is elevated while the sensing occurs, and ramps down to 0 V at t12, when Vwl also ramps down.

The time needed to ramp up Vp-well can be significant due to the relatively large capacitance of the p-well on the substrate. Typically, the p-well extends beneath blocks in a plane. Another type of soft erase, described next, introduces holes into the channel using gate-induced drain leakage (GIDL) from the SGS and/or SGD transistors. This can charge up the channel more quickly to reduce the overall consumed by the soft erase process.

FIG. 20A depicts a configuration of an example memory string just after word lines are discharged at the end of a sensing operation, where SGD and SGS transistor voltages are lowered using coupling in a soft erase operation consistent with step 1702 of FIG. 17. In FIG. 20A-20C, the soft erase uses GIDL to reduce the soft erase time. The GIDL soft erase involves biasing the SGS and/or SGD transistors of a string with a negative gate-to-drain/source voltage. The amount of GIDL hole current is greater when the when the magnitude of the negative gate-to-drain/source voltage is greater.

When a negative voltage is not available in the memory device to directly drive the SGS and/or SGD control gates with a negative voltage, it is possible to down couple the SGS and/or SGD control gate voltages to a negative level using the adjacent word line. In this case, the adjacent word line may be a non-data or dummy word line. For example, the control gate 1211 may represent a dummy word line such as WLD4, and the control gate 1215 may represent a dummy word line such as WLD2 (see FIGS. 4 and 7A).

As described in FIG. 21A-21D, the word line voltages may be ramped down from their peak level of Vpass to an intermediate level, VpassL, before being ramped down to the final level of 0 V. The SGS and/or SGD control gate voltages are ramped down from their peak level to 0 V when the word line voltages are ramped down from Vpass to VpassL. Subsequently, the SGS and/or SGD control gate voltages are floated, e.g., disconnected from a voltage driver, so that they are down coupled to a negative level when the word line voltages are ramped down from VpassL to 0 V. For example, VpassL may be 4.5 V so that the SGS and/or SGD control gate voltages are down coupled to about −4 V. See FIG. 20B. The transition from VpassL to 0 V provides a sufficient amount of down coupling while the transition from Vpass to 0 V might provide excessive down coupling to the SGS and/or SGD control gates. VpassL can be made relatively higher to provide relatively more GIDL hole current.

FIG. 20A shows how the SGS and/or SGD control gate voltages are floated lower from 0 V while the dummy word lines transition from VpassL to 0 V. The data word lines are driven at 0 V to prevent changes due to coupling from the channel. The channel voltage is negative at this time.

FIG. 20B depicts a configuration of an example memory string just after word lines are discharged at the end of a sensing operation, where SGD and SGS transistor voltages are lowered using a driven negative voltage in a soft erase operation consistent with step 1702 of FIG. 17. When a negative voltage is available in the memory device, the SGS and/or SGD control gates can be directly driven with a negative voltage such as −4 V, instead of using the down coupling process of FIG. 20A.

As described in FIG. 22A-22D, the word line voltages may be ramped down from their peak level of Vpass to the final level of 0 V. The SGS and/or SGD control gate voltages are ramped down from their peak level to a negative level. The channel voltage is negative at this time.

FIG. 20C depicts a configuration of an example memory string when holes are introduced into the channel from the SGD and SGS transistors using GIDL and the channel starts to neutralize in a soft erase operation consistent with step 1702 of FIG. 17 and with FIG. 20A or 20B. This configuration shows how holes are generated in the channel from the SGS and/or SGD transistors with the appropriate biasing of these transistors, either due to down coupling or a driven negative voltage. The channel voltage starts to neutralize and subsequently is fully neutralized such as shown in FIG. 18B.

FIG. 21A-21D depict waveforms in a soft erase in which SGS and/or SGD transistors are coupled down to a negative voltage to generate holes by GIDL, consistent with FIGS. 20A and 20C.

FIG. 21A depicts a plot of example waveforms in a read operation followed by a soft erase in which the pass voltage ramps down to VpassL before ramping down to 0 V, consistent with FIGS. 20A and 20C. The waveforms 1115 and 1116 and 1120-1122 of FIG. 10C are repeated. The waveform 1117a corresponds to the waveform 1117 except the word line voltage ramps down to VpassL, an intermediate level, between the peak level of Vpass and 0 V, from t12-t14. The word line voltage is kept at VpassL from t14-t15 to ensure the desired level is reached before being ramped down from VpassL to 0 V at t15. Plot 2110 represents the channel voltage down coupling and then increasing, as discussed previously.

When the word line voltage is ramped down from VpassL to 0 V at t15, this causes down coupling of the SGS and/or SGD control gate voltages as depicted. The SGS and/or SGD transistors at this time are biased to generate holes in the channel due to GIDL, so that the channel is charged up and a soft erase of the memory cells in the block occurs from t15-t17. The word line voltages are driven at 0 V, for example, during the soft erase (plot 2111). Subsequently, after t18, the word line voltages may be floated (plot 2112).

FIG. 21B depicts a channel voltage during one example of a soft erase. Plot 2110 represents the channel voltage which is coupled down starting at t13 and gradually returns to 0 V at t16. A time margin of t17-t16 is provided to ensure that the channel voltage has completed its transition before Vsgd/Vsgs is no longer floated and instead is driven at 0 V back at t17.

FIG. 21C depicts an SGS and/or SGD transistor voltage during one example of a soft erase. The SGS and/or SGD control gate voltage (plot 2120) is ramped down to 0 V from t13-t14a and then floated from t14a-t17 (as indicated by the dashed line).

FIG. 21D depicts a p-well voltage during one example of a soft erase. Vp-well (plot 2130) may remain at a level such as 1 V during the soft erase before ramping down to 0 V at t18.

FIG. 22A-22D depict waveforms in a soft erase in which SGS and/or SGD transistors are driven at a negative voltage to bias the transistors to generate holes by GIDL, consistent with FIGS. 20B and 20C.

FIG. 22A depicts a plot of example waveforms in a read operation followed by a soft erase. Compared to the soft erase of FIG. 21A-21D, this soft erase process can be reduced in time since the pass voltages are not held at VpassL. The waveforms 1115-1117 and 1120-1122 of FIG. 10C are repeated. Waveform 2110 represents the channel voltage down coupling at t13 and then increasing, as discussed previously.

From t13-t14, the SGS and/or SGD control gate voltages are ramped down to a negative voltage, so that the SGS and/or SGD transistors generate holes in the channel due to GIDL. The channel is charged up and a soft erase of the memory cells in the block occurs from t14-t16. The word line voltages are driven at 0 V, for example, during the soft erase (plot 2211). Subsequently, after t17, the word line voltages may be floated (plot 2212).

FIG. 22B depicts a channel voltage during one example of a soft erase. Plot 2210 represents the channel voltage which is coupled down starting at t13 and gradually returns to 0 V at t15. A time margin of t16-t15 is provided to ensure that the channel voltage has completed its transition before Vsgd/Vsgs is ramped up to 0 V back at t16.

FIG. 22C depicts an SGS and/or SGD transistor voltage during one example of a soft erase. The SGS and/or SGD control gate voltage (plot 2220) is ramped down to a negative value from t13-t14 and then ramped up to 0 V from at t16.

FIG. 22D depicts a p-well voltage during one example of a soft erase. Vp-well (plot 2230) may remain at a level such as 1 V during the soft erase before ramping down to 0 V at t17.

Figure 23:
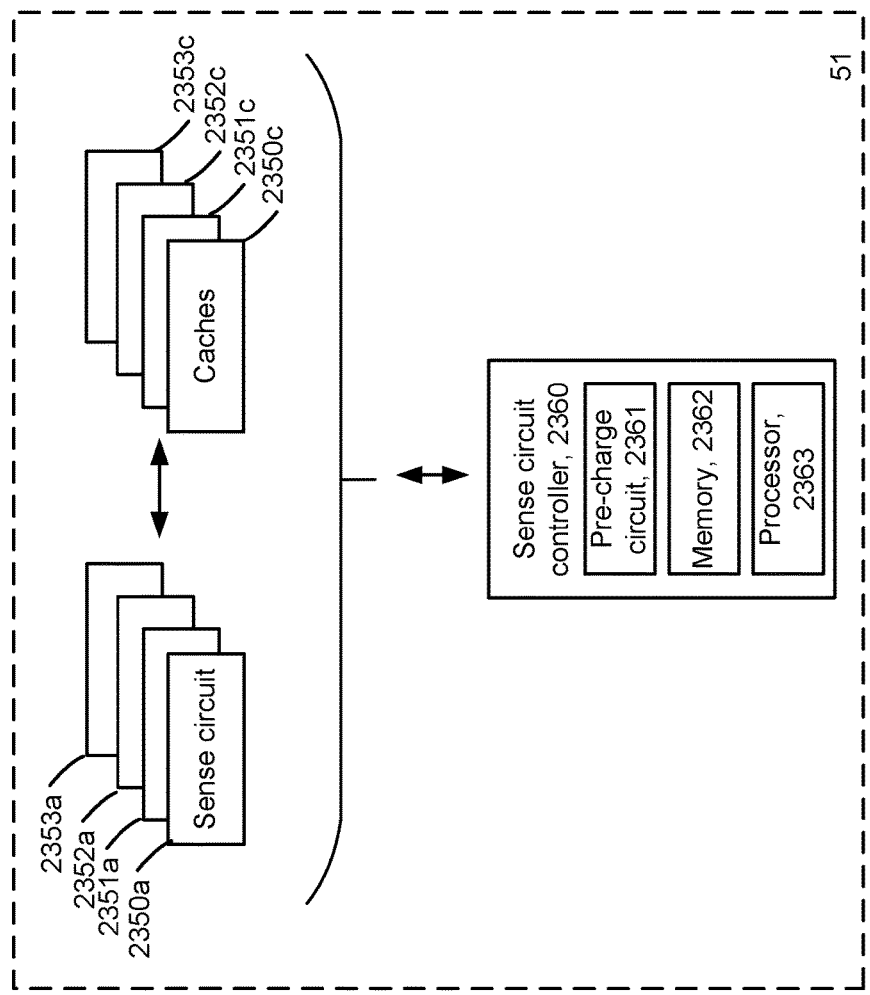
FIG. 23 depicts an example block diagram of a sense block 51 in the column control circuitry of FIG. 1A.

FIG. 23 depicts an example block diagram of a sense block 51 in the column control circuitry of FIG. 1A. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 2350a, 2351a, 2352a and 2353a are associated with caches 2350c, 2351c, 2352c and 2353c, respectively. In one approach, different subsets of bit lines can be sensed using different respective sense blocks. This allows the processing load which is associated with the sense circuits to be divided up and handled by a respective processor in each sense block. For example, a sense circuit controller 2360 can communicate with the set, e.g., sixteen, of sense circuits and latches. The sense circuit controller may include a pre-charge circuit 2361 which provides a voltage to each sense circuit for setting a pre-charge voltage. The sense circuit controller may also include a memory 2362 and a processor 2363.

Figure 24A:
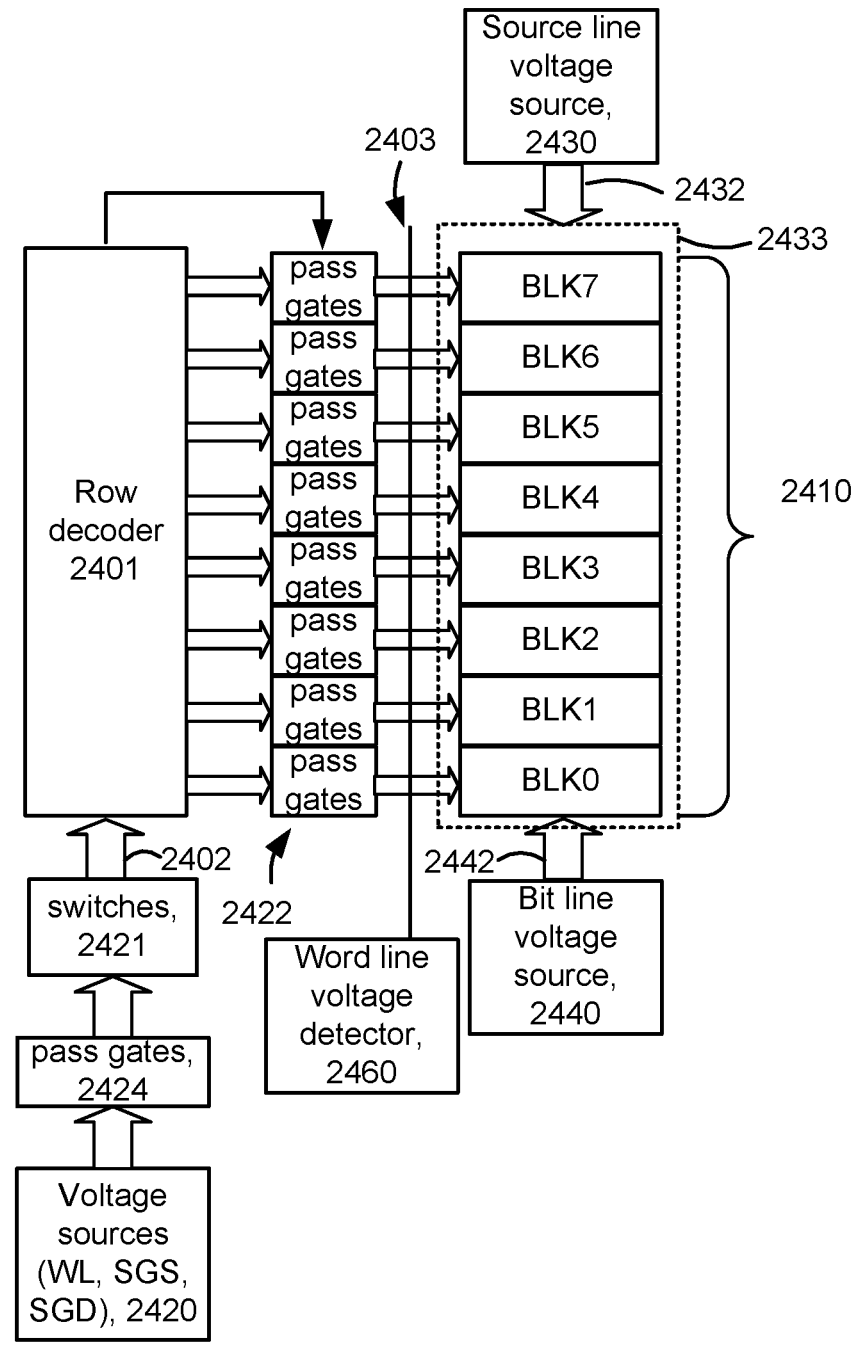
FIG. 24A depicts an example circuit for providing voltages to blocks of memory cells.
Figure 24B:
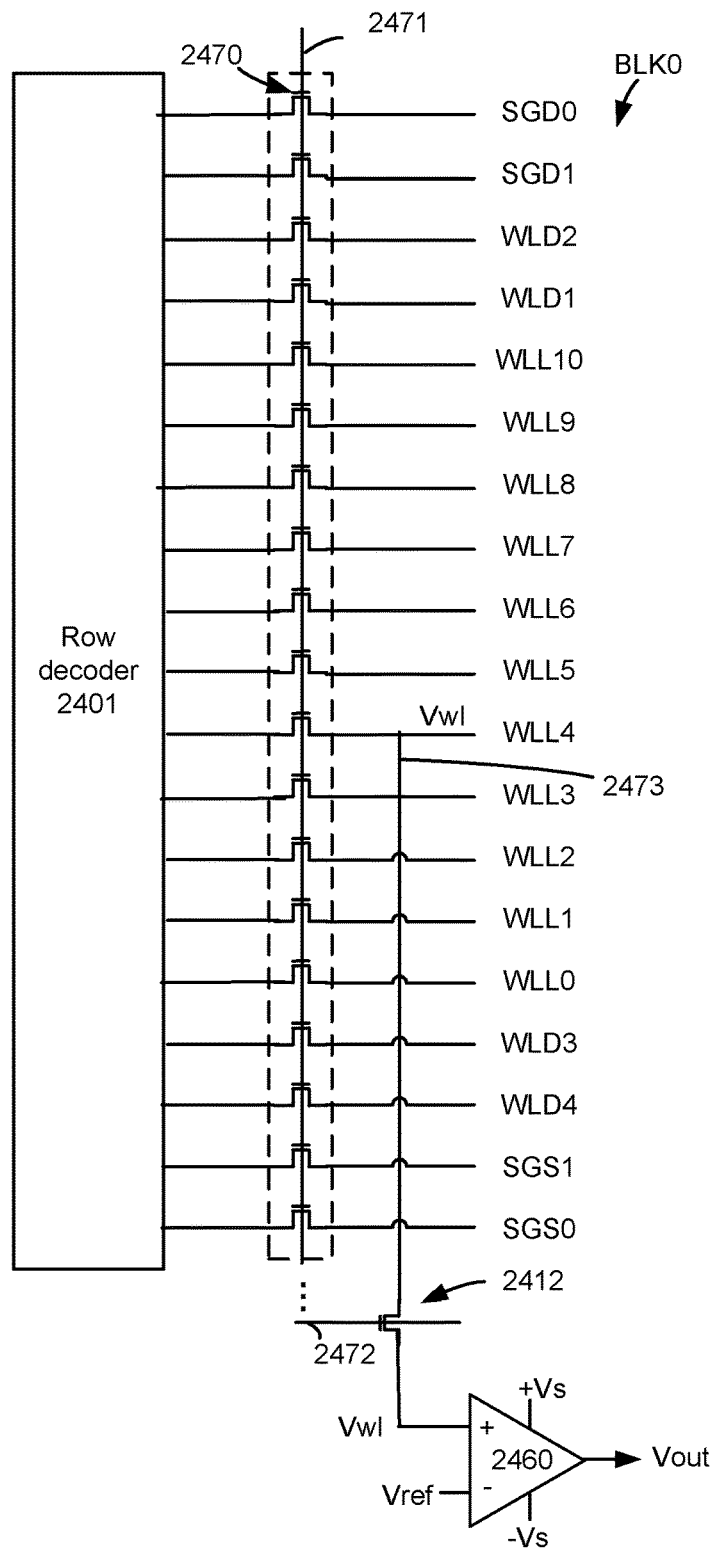
FIG. 24B depicts an example circuit consistent with FIG. 24B for detecting a word line voltage, consistent with the process of FIG. 13A.

FIG. 24A depicts an example circuit for providing voltages to blocks of memory cells. In this example, a row decoder 2401 provides voltages to word lines and select gates of each block in set of blocks 2410. The set could be in a plane and includes blocks BLK0 to BLK7. The row decoder provides a control signal to pass gates 2422 which connect the blocks to the row decoder. Typically, operations, e.g., program, read or erase, are performed on one selected block at a time. The row decoder can connect global control lines 2402 to local control lines 2403 (word lines or select gate lines). The control lines represent conductive paths.

Voltages are provided on the global control lines from voltage sources 2420. The voltage sources may provide voltages to switches 2421 which connect to the global control lines. Pass gates 2424, also referred to as pass transistors or transfer transistors, are controlled to pass voltages from the voltage sources 2420 to the switches 2421. The voltage sources 2420 can provided voltages on word lines (WL), SGS control gates and SGD control gates, for example.

The various components, including the row decoder, may receive commands from a controller such as the state machine 112 or the controller 122 to perform the functions described herein.

A source line voltage source 2430 provides the erase voltage to the source lines/diffusion region (p-well) in the substrate via control lines 2432, in a normal erase or a soft erase. In one approach, the source diffusion region 2433 is common to the blocks. A set of bit lines 2442 is also shared by the blocks. A bit line voltage source 2440 provides voltages to the bit lines. In one possible implementation, the voltage sources 2420 are near the bit line voltage source.

A word line voltage detector 2460 is connected to one of the word lines in each block. The voltage detector may comprise an operational amplifier comparator, for instance, such as depicted in FIG. 24B.

FIG. 24B depicts an example circuit consistent with FIG. 24B for detecting a word line voltage, consistent with the process of FIG. 13A. The circuit comprises a subset of the circuit of FIG. 24A as it relates to the word line voltage detection in an example block. The word lines and select gate lines (control lines) for BLK0 are depicted. A pass gate is connected to each control line. For example, a pass gate 2470 is connected to the SGD0 control line. The control gates of the pass gates are connected to a common path 2471. When a voltage on the path is sufficiently high, the control lines are connected to the voltage drivers via the row decoder 2401. When the voltage on the path is sufficiently low, the control lines are disconnected from the voltage drivers and floated.

In this example, a word line voltage is obtained from WLL4 via a conductive path 2473 which is connected to the word line voltage detector 2460 when a control signal on a line 2472 is sufficiently high to make a pass gate 2412 conductive. The word line voltage detector can comprise a comparator. The comparator includes a non-inverting input which receives the word line voltage, Vwl, an inverting input which receives a reference voltage Vref, positive and negative power supplies +Vs and −Vs, respectively and an output which provides Vout. Vout=+Vs if Vwl>Vref and Vout=−Vs if Vwl<Vref. The analog output value can be provided to a controller which converts it to a 0 or 1 bit to represent Vwl>Vref or Vwl<Vref, respectively. If the bit=0, the controller can select one set of read voltages. If the bit=1, the controller can select another set of read voltages. Moreover, Vwl can be compared to different values of Vref to classify Vwl into more than two ranges. A corresponding set of read voltages can be selected based on the range into which Vwl is classified. See FIGS. 13C and 13D.

In one approach, a first comparison is made between Vwl and a reference voltage having a first level. Then, a second comparison is made between Vwl and the reference voltage having a second level which is based on the first comparison. For example, assume Vref can be set to any one of 1, 2, or 3 V. A first comparison may use Vref=2 V. If Vwl<2 V, a second comparison may use Vref=1 V. In this way, the detector can quickly classify Vwl into one of a number of ranges (e.g., 0-1 V or 1-2 V) to allow a corresponding set of read voltages to be selected.

The voltage which is compared to Vref can be the full word line voltage Vwl or some fraction of the word line voltage, for example. The voltage detector may be in the peripheral area so that there is an appreciable distance between the word line and the detector, resulting in RC delays. A further issue is that the word line in the floating state may have a smaller capacitance than the conductive path 2473. These issues can be considered in the detection process. For example, a voltage of less than 2 V at the detector may correspond to a voltage of 2 V at the word line. The output of the detector can be taken at a specified time after the word line is connected to the detector via the pass gate 2412.

Generally, it is sufficient to measure the voltage of one word line in a block. It is helpful to avoid using an edge word line (e.g., WLL0 or WLL10) since its voltage may be impacted by edge effects. In some cases, a block may be partially programmed so that some word lines at the bottom of the block, starting with WLL0, are programmed while other, higher word lines are not programmed. The programmed state of the cells should not affect the word line voltage reading significantly.

FIG. 25 depicts a memory device 2500 in which a voltage pulse is performed for multiple die, one die at a time, consistent with the process of FIG. 16A. Three memory die 2510, 2520 and 2530 are provided as an example. An off-die control circuit 2502 determines that a voltage pulse is to be applied, such as part of a pre-read operation, and, in response, initiates the application of the voltage pulse starting at one of the die such as the die 2530 by providing a command to the interface 2530*d*. In response to the command, an on-die control circuit 2530*c* instructs the voltage driver 2531 to provide the voltage pulse to the row decoder 2530*b*, and instructs the row decoder to switch the voltage pulse from the voltage driver to the word lines in the array 2530*a*. The on-die control circuit could be the control circuitry 110 of FIG. 1A, for instance. When the operation is completed for the memory die 2530, it reports back to the off-die control circuit.

The off-die control circuit may implement a small wait such as 10 microseconds before causing a voltage pulse is to be applied at the die 2520. The off-die control circuit provides a command to the interface 2520*d*. In response to the command, the on-die control circuit 2520*c* instructs the voltage driver 2521 to provide the voltage pulse to the row decoder 2520*b*, and instructs the row decoder to switch the voltage pulse from the voltage driver to the word lines in the array 2520*a*. When the operation is completed for the memory die 2520, it reports back to the off-die control circuit.

Finally, the off-die control circuit provides a command to the interface 2510*d* of the die 2510. In response to the command, the on-die control circuit 2510*c* instructs the voltage driver 2511 to provide the voltage pulse to the row decoder 2510*b*, and instructs the row decoder to switch the voltage pulse from the voltage driver to the word lines in the array 2510*a*. When the operation is completed for the memory die 2510, it reports back to the off-die control circuit.

As mentioned, the peak power consumption of the voltage drivers is reduced since the voltage pulse is applied at one die at a time.

In one implementation, an apparatus comprises: a block of memory cells, the memory cells are connected to a set of word lines; a voltage detector connected to one or more word lines of the set of word lines, the voltage detector is configured to perform an evaluation of a voltage of the one or more word lines; and a control circuit in communication with the voltage detector, the control circuit is configured to determine a set of read voltages for reading selected memory cells in the block based on the evaluation.

A method includes: in response to a read command involving selected memory cells of a block, determining if a condition is met to apply a pre-read voltage pulse to the selected memory cells prior to reading the selected memory cells; if the condition is met, applying the pre-read voltage pulse to the selected memory cells prior to reading the selected memory cells; and if the condition is not met, reading the selected memory cells without applying the pre-read voltage pulse to the selected memory cells.

Another related apparatus includes means for performing each of the above steps. The means described above can include the components of the memory device 100 of FIG. 1A and FIG. 2, for example. The power control module 116, for instance, controls the power and voltages supplied to the word lines, select gate lines and bit lines during memory operations. Moreover, the means described above can include the components of FIGS. 24A and 24B including the voltage drivers, switches and pass transistors. The means can further include any of the control circuits in FIGS. 1A and 2 such as the control circuitry 110 and controller 122.

In another implementation, an apparatus comprises: timing means for periodically determining a time to refresh threshold voltages of a set of memory cells, the set of memory cells comprises one or more blocks of memory cells; and means for applying a voltage pulse to a set of words line connected to the memory cells of each block of the one or more blocks, responsive to the timing means.

In another implementation, an apparatus comprises: a block of memory cells; and a control circuit configured to, in response to a read or program command involving selected memory cells of the block, sense the selected memory cells followed by performance of a soft erase of the block of memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a block of memory cells, the memory cells are connected to a set of word lines;
a voltage detector connected to one or more word lines of the set of word lines, the voltage detector is configured to perform an evaluation of a voltage of the one or more word lines; and
a control circuit in communication with the voltage detector, the control circuit is configured to determine a read voltage for reading selected memory cells in the block based on the evaluation, the selected memory cells connected to a word line which is not connected to the voltage detector.

2. The apparatus of claim 1, wherein:
the voltage detector is configured to receive one or more reference voltages and compare the voltage of the one or more word lines to each of the one or more reference voltages; and
the control circuit is configured to select the read voltage from among a plurality of read voltages based on the compare of the voltage of the one or more word lines to each of the one or more reference voltages.

3. The apparatus of claim 1, wherein:
the control circuit is configured to cause the voltage detector to perform the evaluation in response to receiving a read command involving the block.

4. A method, comprising:
in response to a read command involving selected memory cells of a block, determining that a condition is met to apply a pre-read voltage pulse to the selected memory cells prior to reading the selected memory cells, the determining that the condition is met comprises evaluating a voltage of one or more word lines connected to memory cells of the block and determining that the voltage is below a threshold; and
when the condition is met, applying the pre-read voltage pulse to the selected memory cells prior to reading the selected memory cells.

5. The method of claim 4, wherein:
the determining that the condition is met comprises determining that an elapsed time since a last sensing of the block exceeds a threshold.

6. The method of claim 5, further comprising:
setting the duration and/or magnitude of the pre-read voltage pulse based on the elapsed time.

7. The method of claim 4, wherein:
the condition is met when a previous read of the selected memory cells resulted in one or more uncorrectable errors.

8. The method of claim 4, further comprising:
setting a duration and/or magnitude of the pre-read voltage pulse based on the evaluating.

9. The method of claim 4, further comprising:
increasing a duration of the pre-read voltage pulse as the voltage of one or more word lines decreases.

10. The method of claim 4, further comprising:
increasing a magnitude of the pre-read voltage pulse as the voltage of one or more word lines decreases.

11. The method of claim 5, further comprising:
increasing a duration of the pre-read voltage pulse as the elapsed time increases.

12. The method of claim 5, further comprising:
increasing a magnitude of the pre-read voltage pulse as the elapsed time increases.

13. The method of claim 4, further comprising:
increasing a duration of the pre-read voltage pulse as a temperature decreases.

14. The method of claim 4, further comprising:
increasing a magnitude of the pre-read voltage pulse as a temperature decreases.

15. An apparatus, comprising:
a block of memory cells, the memory cells are connected to a set of word lines;
a voltage detector connected to one or more word lines of the set of word lines, the voltage detector is configured to perform an evaluation of a voltage of the one or more word lines; and
a control circuit in communication with the voltage detector, the control circuit is configured to determine a read voltage for reading selected memory cells in the block based on the evaluation, the control circuit is configured to cause the voltage detector to perform the evaluation according to a periodic polling of the block.

16. An apparatus, comprising:
a block of memory cells, the memory cells are connected to a set of word lines;
a voltage detector connected to one or more word lines of the set of word lines, the voltage detector is configured to perform an evaluation of a voltage of the one or more word lines; and
a control circuit in communication with the voltage detector, the control circuit is configured to determine a read voltage for reading selected memory cells in the block based on the evaluation, the control circuit is configured to cause the voltage detector to perform the evaluation in response to a determination that a previous read of memory cells in the block resulted in one or more uncorrectable errors.

\* \* \* \* \*